(12) United States Patent
Ahn et al.

(10) Patent No.: US 12,361,747 B2
(45) Date of Patent: Jul. 15, 2025

(54) DISPLAY DEVICE

(71) Applicant: Samsung Display Co., Ltd., Yongin-Si (KR)

(72) Inventors: Taekyung Ahn, Yongin-si (KR); Sangwoo Kim, Yongin-si (KR); Hyeonsik Kim, Yongin-si (KR); Dae-Young Lee, Yongin-si (KR); Sanghwan Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/107,704

(22) Filed: Feb. 9, 2023

(65) Prior Publication Data

US 2023/0326234 A1    Oct. 12, 2023

(30) Foreign Application Priority Data

Apr. 6, 2022   (KR) .......................... 10-2022-042875

(51) Int. Cl.
| | |
|---|---|
| *G06V 40/13* | (2022.01) |
| *G09G 3/3233* | (2016.01) |
| *H10K 39/00* | (2023.01) |
| *H10K 59/00* | (2023.01) |

(52) U.S. Cl.
CPC ....... *G06V 40/1318* (2022.01); *G09G 3/3233* (2013.01); *H10K 39/501* (2023.02); *H10K 59/771* (2023.02); *G09G 2300/0426* (2013.01); *G09G 2300/0819* (2013.01); *G09G 2300/0842* (2013.01); *G09G 2300/0861* (2013.01); *G09G 2310/08* (2013.01); *G09G 2354/00* (2013.01)

(58) Field of Classification Search
CPC ......... G09G 3/3233; G09G 2300/0426; G09G 2300/0819; G09G 2300/0842; G09G 2300/0861; G09G 2310/08; G09G 2354/00; H10K 39/501; H10K 59/771; G06V 40/1318
See application file for complete search history.

(56) References Cited

U.S. PATENT DOCUMENTS

| | | | |
|---|---|---|---|
| 6,963,092 B2 * | 11/2005 | Lee ...................... | H10F 39/803 |
| | | | 257/230 |
| 8,994,712 B2 * | 3/2015 | Park .................... | G02F 1/13338 |
| | | | 345/173 |
| 10,552,696 B2 * | 2/2020 | Cho ...................... | G06F 3/0412 |
| (Continued) | | | |

FOREIGN PATENT DOCUMENTS

| | | |
|---|---|---|
| DE | 112020003393 | 3/2022 |
| EP | 3767681 | 1/2021 |
| (Continued) | | |

*Primary Examiner* — Ke Xiao
*Assistant Examiner* — Jennifer L Zubajlo
(74) *Attorney, Agent, or Firm* — F. CHAU & ASSOCIATES, LLC

(57) ABSTRACT

A display device including: a display layer including a light emitting device, a photo-detector, and a dummy device; and a circuit layer including a pixel driving part, which is connected to the light emitting device, and a sensor driving part which is connected to the photo-detector, wherein the light emitting device and the dummy device are overlapped with the pixel driving part, and wherein the photo-detector is overlapped with the sensor driving part.

17 Claims, 14 Drawing Sheets

(56) References Cited

U.S. PATENT DOCUMENTS

| | | | | |
|---|---|---|---|---|
| 2011/0148834 A1* | 6/2011 | Baek | ............... | G09G 3/3406 345/207 |
| 2014/0240372 A1* | 8/2014 | Pak | ............... | G09G 3/3233 345/77 |
| 2016/0104740 A1* | 4/2016 | Kim | ............... | H10F 39/8053 257/292 |
| 2018/0285619 A1* | 10/2018 | Kim | ............... | G09G 3/3208 |
| 2018/0315357 A1* | 11/2018 | Nam | ............... | G09F 13/22 |
| 2019/0148457 A1* | 5/2019 | Lee | ............... | H10K 39/32 257/40 |
| 2020/0212138 A1* | 7/2020 | Lee | ............... | H10K 50/818 |
| 2020/0334435 A1* | 10/2020 | Hung | ............... | G06V 40/1318 |
| 2021/0020710 A1* | 1/2021 | Park | ............... | H10K 50/11 |
| 2021/0050403 A1* | 2/2021 | Lee | ............... | H10K 71/00 |
| 2021/0151511 A1* | 5/2021 | Kim | ............... | H10K 59/65 |
| 2021/0200366 A1* | 7/2021 | Bok | ............... | H10K 59/873 |
| 2021/0232287 A1* | 7/2021 | Saitoh | ............... | G06F 3/0412 |
| 2021/0367020 A1* | 11/2021 | Bok | ............... | H10K 59/1213 |
| 2022/0163701 A1* | 5/2022 | Akutsu | ............... | G02B 5/208 |
| 2022/0173174 A1* | 6/2022 | Hatsumi | ............... | H10K 59/30 |
| 2022/0181406 A1* | 6/2022 | Seo | ............... | G06F 3/0412 |
| 2022/0278177 A1* | 9/2022 | Kubota | ............... | H10K 59/352 |
| 2023/0079769 A1* | 3/2023 | Park | ............... | H10K 59/1315 345/82 |
| 2023/0116805 A1* | 4/2023 | Kim | ............... | G09G 3/3233 345/76 |
| 2023/0121262 A1* | 4/2023 | Chen | ............... | G06V 40/12 324/686 |
| 2023/0215365 A1* | 7/2023 | Lee | ............... | G06F 21/32 345/204 |

FOREIGN PATENT DOCUMENTS

| | | | | |
|---|---|---|---|---|
| KR | 10-2018-0067196 | | 6/2018 | |
| KR | 10-2019-0081730 | | 7/2019 | |
| KR | 10-2021-0010681 | | 1/2021 | |
| WO | 2020165686 | | 8/2020 | |
| WO | WO-2020165686 A1 * | 8/2020 | ............ | G02B 5/003 |

\* cited by examiner

DISPLAY DEVICE

CROSS-REFERENCE TO RELATED APPLICATION

This application claims priority under 35 U.S.C. § 119 to Korean Patent Application No. 10-2022-0042875 filed on Apr. 6, 2022, in the Korean Intellectual Property Office, the disclosure of which is incorporated by reference herein in its entirety.

TECHNICAL FIELD

Embodiments of the present disclosure described herein relate to a display device. More particularly, embodiments of the present disclosure described herein relate to a display device for recognizing biometric information.

DISCUSSION OF RELATED ART

A display device is an output device for presentation of information in visual form. For example, a display device displays an image to provide information to a user or provides various functions, such as a function of sensing an input of a user, for communicating with the user. Recently, a display device has a function of sensing biometric information, such as fingertips, eyes and facial characteristics, of a user.

Techniques for recognizing biometric information include a capacitive technique, an optical technique and an ultrasonic technique. In the capacitive technique, a change in capacitance formed between electrodes may be sensed, in the optical technique, an incident light may be sensed by using a light sensor, and in the ultrasonic technique, vibration may be sensed by utilizing a piezoelectric body.

SUMMARY

Embodiments of the present disclosure provide a display device including a display panel having a sensor to recognize biometric information, in which space for a pixel driving circuit may be ensured by reducing the number of sensor driving circuits. In addition, the resolution of the display panel may be increased.

According to an embodiment of the present disclosure, a display device includes: a display layer including a light emitting device, a photo-detector, and a dummy device; and a circuit layer including a pixel driving part, which is connected to the light emitting device, and a sensor driving part which is connected to the photo-detector, wherein the light emitting device and the dummy device are overlapped with the pixel driving part, and wherein the photo-detector is overlapped with the sensor driving part.

The light emitting device includes: a first electrode and a second electrode facing each other; and a light emitting layer interposed between the first electrode and the second electrode to emit red light, blue light, or green light.

The photo-detector includes: a first electrode and a second electrode facing each other; and a photo-electric converting layer interposed between the first electrode and the second electrode to convert incident light to an electrical signal.

The dummy device is disposed in the same layer as a layer of the photo-electric converting layer, and is floated.

The pixel driving part includes: a pixel driving circuit configured to drive the light emitting device, and wherein the sensor driving part includes: a sensor driving circuit configured to drive the photo-detector.

A plurality of unit pixel regions are provided and unit pixels are disposed in the unit pixel regions, each unit pixel including the light emitting device, and the photo-detector or the dummy device, and wherein the photo-detector is disposed in a first unit pixel region of two adjacent unit pixel regions of the plurality of unit pixel regions, and the dummy device is disposed in a second unit pixel region of two adjacent unit pixel regions of the plurality of unit pixel regions.

The number of the photo-detectors disposed in the first unit pixel and the number of the dummy devices disposed in the second unit pixel region are the same.

'n' number of the sensor driving parts are disposed in '2n' number of unit pixel regions, which are adjacent to each other, of the plurality of unit pixel regions, and wherein the 'n' is a natural number.

The 'n' number of sensor driving parts are electrically connected to 'n' number of photo-detectors, respectively.

The sensor driving part is interposed between the two adjacent unit pixel regions, when viewed in a plan view.

According to an embodiment of the present disclosure, a display device includes: a display layer including a light emitting device, and a photo-detector; and a circuit layer including a pixel driving part, which is connected to the light emitting device, and a sensor driving part which is connected to the photo-detector, wherein the sensor driving part is electrically connected to a plurality of photo-detectors.

A plurality of unit pixel regions are provided and 'x' (which is a natural number equal to or more than 1) number of light emitting devices and 'y' (which is a natural number equal to or more than 1) number of photo-detectors are disposed in the unit pixel regions, wherein each of the photo-detectors include: a first photo-detector; and a second photo-detector, and wherein the first photo-detector is disposed in a first unit pixel region of two adjacent unit pixel regions of the plurality of unit pixel regions, and the second photo-detector is disposed in a second unit pixel region of the two adjacent unit pixel regions.

The first photo-detector and the second photo-detector are electrically connected to the sensor driving part.

The display layer further includes: a connection part to electrically connect the first photo-detector to the second photo-detector, and wherein the connection part is electrically connected to the sensor driving part.

'2x' number of pixel driving parts and 'y' number of sensor driving parts are disposed in the two adjacent unit pixel regions of the plurality of unit pixel regions.

The sensor driving part is overlapped with the two adjacent unit pixel regions, when viewed in a plan view.

The light emitting device is connected to the pixel driving part one to one.

The sensor driving part is interposed between two pixel driving parts disposed in the two adjacent unit pixel regions.

The photo-detector includes: a first electrode and a second electrode facing each other, and a photo-electric converting layer interposed between the first electrode and the second electrode to convert incident light to an electrical signal.

The light emitting device includes: a first electrode and a second electrode facing each other; and a light emitting layer interposed between the first electrode and the second electrode to emit red light, blue light, or green light.

According to an embodiment of the present disclosure, a display device includes: a display layer including a light emitting device and a photo-detector; and a circuit layer including a pixel driving part, which is connected to the light emitting device, and a sensor driving part which is connected to the photo-detector, wherein the light emitting device is overlapped with the pixel driving part, and wherein the photo-detector is overlapped with the sensor driving part.

BRIEF DESCRIPTION OF THE FIGURES

The above and other features of the present disclosure will become apparent by describing in detail embodiments thereof with reference to the accompanying drawings.

FIG. 1l is a waveform diagram illustrating the operation of a sensor driving circuit illustrated in FIG. 10.

DETAILED DESCRIPTION OF THE EMBODIMENTS

Figure 1:
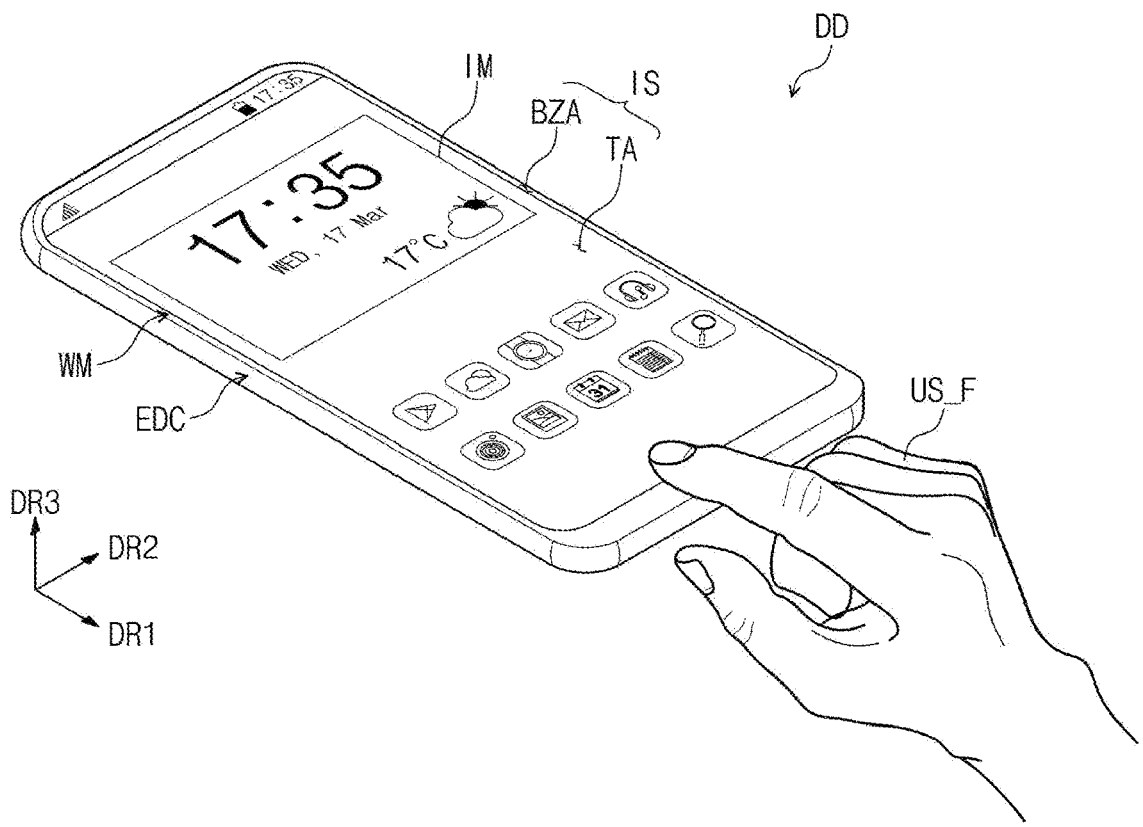
FIG. 1 is a perspective view of a display device according to an embodiment of the present disclosure.

In the specification, the expression that a first component (or region, layer, part, portion, etc.) is "on", "connected with", or "coupled to" a second component may mean that the first component is directly on, connected with, or coupled to the second component or may mean that a third component is disposed therebetween.

The same reference numerals may refer to the same components in the specification. In addition, in the drawings, thicknesses, proportions, and dimensions of components may be exaggerated to describe certain technical features effectively. The expression "and/or" may include one or more combinations of the associated components.

Although the terms "first", "second", etc. may be used to describe various components, the components should not be construed as being limited by the terms. The terms are used to distinguish one component from another component. For example, a first component may be referred to as a second component, and similarly, the second component may be referred to as the first component. The singular forms may include the plural forms unless the context clearly indicates otherwise.

In addition, the terms "under", "below", "on", "above", etc. are used to describe the correlation of components illustrated in the drawings. The terms that are relative in concept are described based on a direction shown in the drawings.

It will be understood that the terms "include", "comprise", "have", etc. specify the presence of features, numbers, steps, operations, elements, or components, described in the specification, or a combination thereof, not precluding the presence or additional possibility of one or more other features, numbers, steps, operations, elements, or components or a combination thereof.

Unless otherwise defined, all terms (including technical terms and scientific terms) used in the specification have the same meaning as commonly understood by one skilled in the art to which the present disclosure belongs. Furthermore, terms such as terms defined in commonly used dictionaries should be interpreted as having a meaning consistent with the meaning in the context of the related technology, and should not be interpreted in an ideal or overly formal meaning unless explicitly defined herein.

Hereinafter, an embodiment of the present disclosure will be described with reference to the accompanying drawings.

Figure 2:
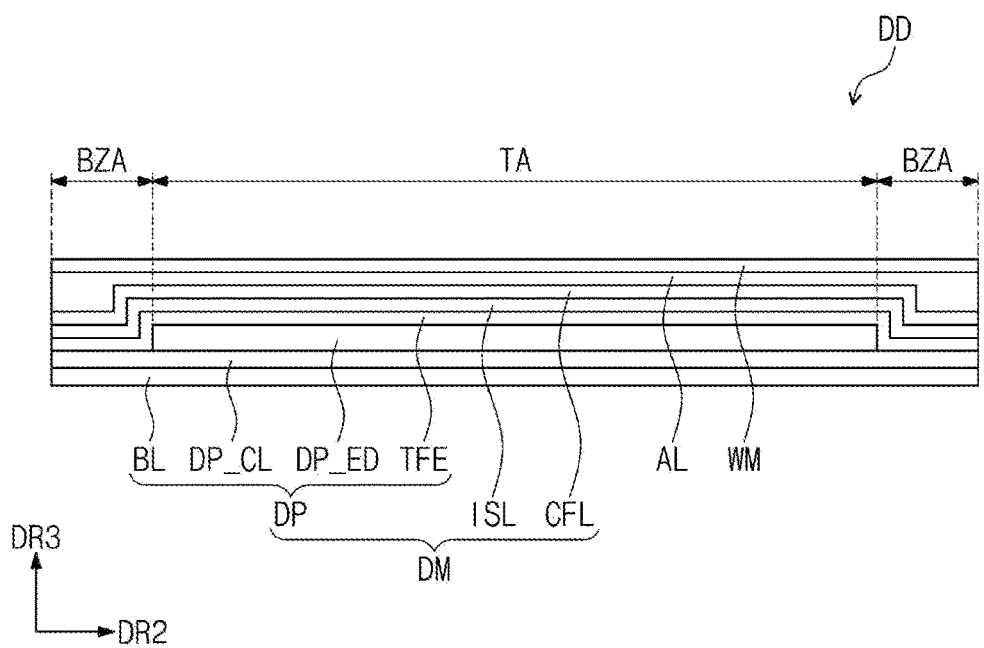
FIG. 2 is a cross-sectional view of a display device according to an embodiment of the present disclosure.

FIG. 1 is a perspective view of a display device according to an embodiment of the present disclosure, and FIG. 2 is a cross-sectional view of a display device according to an embodiment of the present disclosure.

Referring to FIGS. 1 and 2, a display device DD according to an embodiment of the present disclosure may have a shape of a rectangle having longer sides parallel to a first direction DR1 and shorter sides parallel to a second direction DR2 crossing the first direction DR1. However, the present disclosure is not limited thereto. For example, the display device DD may have various shapes such as a circle and a polygon.

The display device DD may be a device activated in response to an electrical signal. The display device DD may include various embodiments. For example, the display device DD may be applied to an electronic device, such as a smart watch, a tablet personal computer (PC), a notebook computer, a computer, or a smart television.

Hereinafter, a normal direction, which is substantially perpendicular to a plane formed by the first direction DR1 and the second direction DR2, is referred to as a third direction DR3. In the specification, the meaning of "when viewed in a plan view" may refer to "when viewed in the third direction DR3".

A top surface of the display device DD may be referred to as a display surface IS, and may have a plane formed by the first direction DR1 and the second direction DR2. Images IM generated by the display device DD may be provided to a user through the display surface IS.

The display surface IS may be divided into a transmission region TA and a bezel region BZA. The transmission region TA may be a region for displaying the images IM. The user may visually perceive the images IM through the transmission region TA. According to an embodiment, the transmission region TA is illustrated in the shape of a rectangle having rounded vertexes. However, the shape is provided for illustrative purposes. For example, the transmission region TA may have various shapes, and is not limited to any one embodiment.

The bezel region BZA is adjacent to the transmission region TA. The bezel region BZA may have a specific color. The bezel region BZA may surround the transmission region TA. Accordingly, the shape of the transmission region TA may depend on the bezel region BZA. However, the features of the bezel region BZA are provided for illustrative purposes. For example, the bezel region BZA may be adjacent to only one side of the transmission region TA or may be omitted.

The display device DD may sense an external input applied from the outside. The external input may include various inputs applied from an outside of the display device DD. For example, in addition to contact by a part of a user's body, such as a user's hand US_F, the external input may include an external input (for example, a hovering input) which is applied when the user's hand approaches the display device DD or is adjacent to the display device DD within a specific distance. In addition, the external input may have various types such as force, pressure, temperature, light, and the like.

The display device DD may detect biometric information of the user applied from the outside. A region for sensing the biometric information may be provided on the display surface IS of the display device DD. The region for sensing the biometric information may be provided in the entire portion of the transmission region TA or may be provided in a partial region of the transmission region TA. Although FIG. 1 illustrates that the whole transmission region TA is utilized as the region for sensing the biometric information, the present disclosure is not limited thereto. For example, the region for sensing the biometric information may be implemented with a portion of the transmission region TA.

The display device DD may include a window WM, a display module DM, and a housing EDC. According to an embodiment, the window WM and the housing EDC are coupled to each other to form the outer appearance of the display device DD.

A front surface of the window WM forms the display surface IS of the display device DD. The window WM may include an optically transparent insulating material. For example, the window WM may include glass or plastic. The window WM may include a multi-layer structure or a single layer structure. For example, the window WM may include a plurality of plastic films bonded by an adhesive or may have a glass substrate and a plastic film bonded by an adhesive.

The display module DM may include a display panel DP and an input sensing layer ISL. The display panel DP may display an image depending on an electrical signal, and the input sensing layer ISL may sense an external input applied from the outside. The external input may be provided in various forms from the outside. For example, the external input may be that of the user's hand US_F.

The display panel DP according to an embodiment of the present disclosure may be a light emitting display panel and is not particularly limited thereto. For example, the display panel DP may be an organic light emitting display panel, an inorganic light emitting display panel, or a quantum dot light emitting display panel. A light emitting layer of the organic light emitting display panel may include an organic light emitting material, and a light emitting layer of the inorganic light emitting display panel may include an inorganic light emitting material. The light emitting layer of the quantum dot light emitting display panel may include a quantum dot, or a quantum rod. Hereinafter, the display panel DP including the organic light emitting display panel will be described.

Referring to FIG. 2, the display panel DP includes a base layer BL, a circuit layer DP_CL, a display layer DP_ED, and an encapsulating layer TFE. The base layer BL, the circuit layer DP_CL, the display layer DP_ED, and the encapsulating layer TFE may be sequentially arranged. The display panel DP according to the present disclosure may be a flexible display panel. However, the present disclosure is not limited thereto. For example, the display panel DP may be a foldable display panel, which is folded with respect to a folding axis, or a rigid display panel.

The base layer BL may include a synthetic resin layer. The synthetic resin layer may be a polyimide-based resin layer, and the material thereof is not particularly limited. The base layer BL may also include a glass substrate, a metal substrate, or an organic/inorganic composite substrate.

The circuit layer DP_CL is disposed on the base layer BL. The circuit layer DP_CL includes at least one insulating layer and a circuit device. Hereinafter, the insulating layer included in the circuit layer DP_CL is referred to as an "intermediate insulating layer". The intermediate insulating layer includes at least one intermediate inorganic film and at least one intermediate organic film. The circuit device may include a pixel driving circuit included in each of a plurality of pixels to display an image and a sensor driving circuit included in each of a plurality of sensors to recognize external information. The external information may be biometric information. According to an embodiment of the present disclosure, the sensor may include a fingerprint recognition sensor, a proximity sensor, or an iris recognition sensor. In addition, the sensor may include an optical sensor that recognizes biometric information using an optical technique. The circuit layer DP_CL may further include a pixel driving part including the pixel driving circuit, a sensor driving part including the sensor driving circuit, and signal lines connected with the pixel driving circuit and the sensor driving circuit.

The display layer DP_ED may include a light emitting device included in each of the pixels and a photo-detector included in each of the sensors. The display layer DP_ED may be only located in the transmission region TA; however, the present disclosure is not limited thereto. According to an embodiment of the present disclosure, the photo-detector may be a photodiode. An optical fingerprint sensor may detect a light reflected by a fingerprint of the user. The details of the display layer DP_ED and the circuit layer DP_CL will be described later The encapsulating layer TFE encapsulates the display layer DP_ED. The encapsulating layer TFE may include at least one organic film and at least one inorganic film. The inorganic film may include an inorganic material and may protect the display layer DP_ED from moisture/oxygen. The inorganic film may include a silicon nitride layer, a silicon oxynitride layer, a silicon oxide layer, a titanium oxide layer, or an aluminum oxide layer, but is not limited particularly thereto. The organic film may include an organic material and may protect the display layer DP_ED from foreign substances such as dust particles.

The input sensing layer ISL may be formed on the display panel DP. The input sensing layer ISL may be directly disposed on the encapsulating layer TFE. According to an embodiment of the present disclosure, the input sensing layer ISL may be formed on the display panel DP through a subsequent process. In other words, when the input sensing layer ISL is directly disposed on the display panel DP, an adhesive film is not interposed between the input sensing layer ISL and the encapsulating layer TFE. However, alternatively, an inner adhesive film may be interposed between the input sensing layer ISL and the display panel DP. In this case, the input sensing layer ISL may not be manufactured through a process subsequent to the process of the display panel DP. In other words, the input sensing layer ISL may be manufactured through a process separate from the process of the display panel DP and may then be fixed on a top surface of the display panel DP by the inner adhesive film.

The input sensing layer ISL may sense an external input (e.g., a touch of the user), may change the sensed input into a specific input signal, and may provide the input signal to the display panel DP. The input sensing layer ISL may include a plurality of sensing electrodes to sense the external input. The sensing electrodes may sense the external input using a capacitive technique. The display panel DP may receive the input signal from the input sensing layer ISL and may generate an image corresponding to the input signal.

The display module DM may further include a color filter layer CFL. According to an embodiment of the present disclosure, the color filter layer CFL may be disposed on the input sensing layer ISL. However, the present disclosure is not limited thereto. The color filter layer CFL may be disposed between the display panel DP and the input sensing layer ISL. The color filter layer CFL may include a plurality of color filters and a black matrix.

The display device DD according to an embodiment of the present disclosure may further include an adhesive layer AL. The window WM may be attached to the input sensing layer ISL by the adhesive layer AL. The adhesive layer AL may include an optical clear adhesive, an optically clear adhesive resin, or a pressure sensitive adhesive (PSA).

The housing EDC is coupled to the window WM. The housing EDC is coupled to the window WM to provide a specific inner space. The display module DM may be received in the inner space. The housing EDC may include a material having high rigidity. For example, the housing EDC may include glass, plastic, or metal or may include a plurality of frames and/or plates that include a combination thereof. The housing EDC may stably protect components of the display device DD, which are received in the inner space of the housing EDC, from an external impact. A battery module may be interposed between the display module DM and the housing EDC to supply power necessary for an overall operation of the display device DD.

Figure 3:
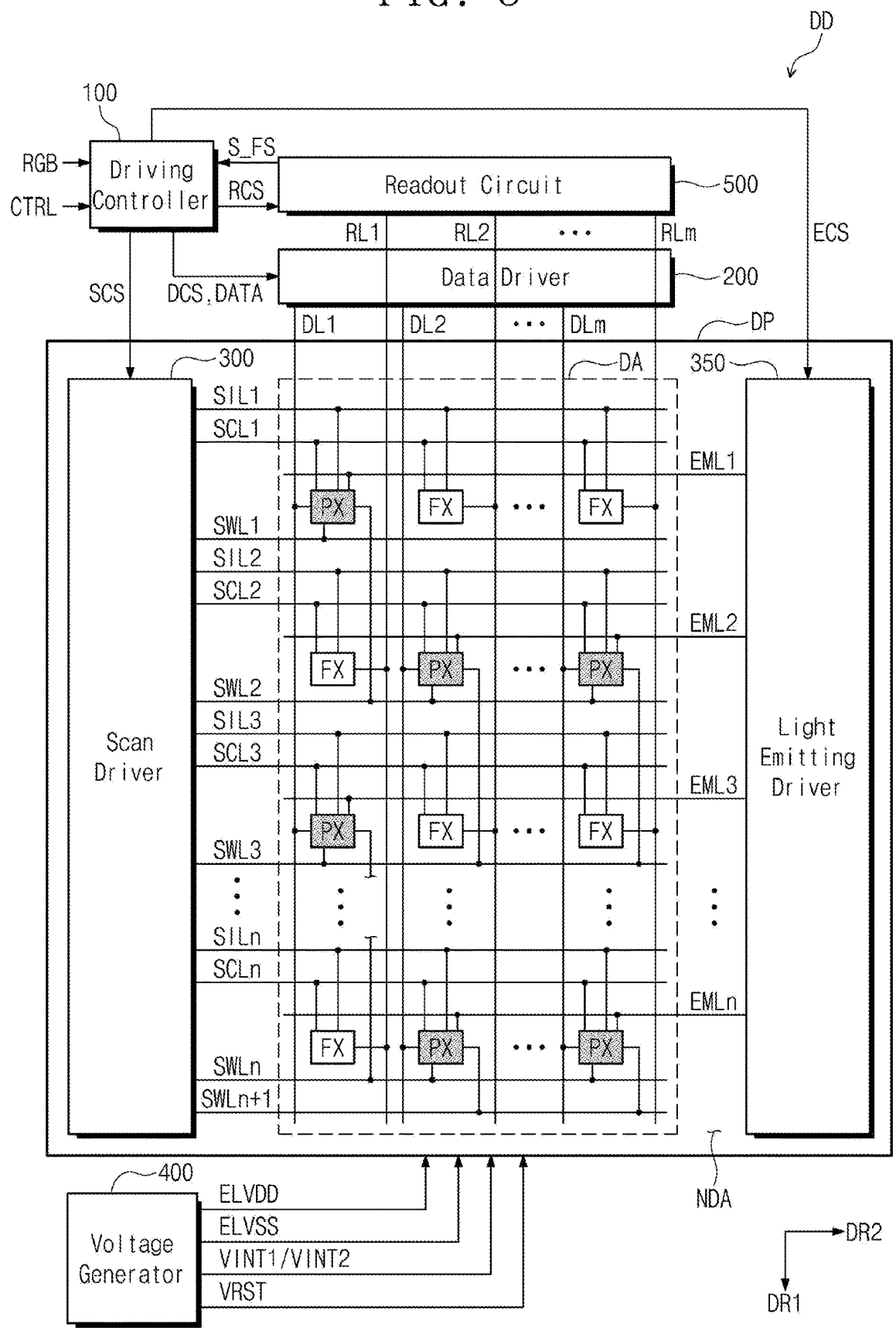
FIG. 3 is a block diagram of a display device according to an embodiment of the present disclosure.

FIG. 3 is a block diagram of a display device according to an embodiment of the present disclosure.

Referring to FIG. 3, the display device DD includes the display panel DP, a panel driver, and a driving controller 100. According to an embodiment of the present disclosure, the panel driver includes a data driver 200, a scan driver 300, a light emitting driver 350, a voltage generator 400, and a readout circuit 500.

The driving controller 100 receives an image signal RGB and a control signal CTRL. The driving controller 100 generates an image data signal DATA by converting a data format of the image signal RGB in compliance with the specification for an interface with the data driver 200. The driving controller 100 outputs a first control signal SCS, a second control signal ECS, a third control signal DCS, and a fourth control signal RCS.

The data driver 200 receives the third control signal DCS and the image data signal DATA from the driving controller 100. The data driver 200 converts the image data signal DATA into data signals and outputs the data signals to a plurality of data lines DL1 to DLm to be described later. The data signals refer to analog voltages corresponding to a gray scale value of the image data signal DATA.

The scan driver 300 receives the first control signal SCS from the driving controller 100. The scan driver 300 may output scan signals to scan lines in response to the first control signal SCS.

The voltage generator 400 generates voltages necessary for an operation of the display panel DP. According to an embodiment, the voltage generator 400 generates a first driving voltage ELVDD, a second driving voltage ELVSS, a first initialization voltage VINT1, a second initialization voltage VINT2, and a reset voltage VRST.

The display panel DP may include a display region DA corresponding to the transmission region TA (illustrated in FIG. 1) and a non-display region NDA corresponding to the bezel region BZA (illustrated in FIG. 1).

The display panel DP may include a plurality of pixels PX disposed in the display region DA and a plurality of sensors FX disposed in the display region DA. According to an embodiment of the present disclosure, each of the plurality of sensors FX may be disposed between two adjacent pixels PX. The plurality of pixels PX and the plurality of sensors FX may be alternately disposed in the first and second directions DR1 and DR2.

The display panel DP further includes initialization scan lines SIL1 to SILn, compensation scan lines SCL1 to SCLn, write scan lines SWL1 to SWLn+1, light emitting control lines EML1 to EMLn, the data lines DL1 to DLm, and readout lines RL1 to RLm. The initialization scan lines SIL1 to SILn, the compensation scan lines SCL1 to SCLn, the write scan lines SWL1 to SWLn+1, and the light emitting control lines EML1 to EMLn extend in the second direction DR2. The initialization scan lines SIL1 to SILn, the compensation scan lines SCL1 to SCLn, the write scan lines SWL1 to SWLn+1, and the light emitting control lines EML1 to EMLn are spaced from one another in the first direction DR1. The data lines DL1 to DLm and the readout lines RL1 to RLm extend in the first direction DR1 and are spaced from each other in the second direction DR2.

The plurality of pixels PX are electrically connected to the initialization scan lines SIL1 to SILn, the compensation scan lines SCL1 to SCLn, the write scan lines SWL1 to SWLn+1, the light emitting control lines EML1 to EMLn, and the data lines DL1 to DLm, respectively. Each of the plurality of pixels PX may be electrically connected with four scan lines. For example, as illustrated in FIG. 3, pixels in a first row may be connected to the first initialization scan line SIL1, the first compensation scan line SCL1, and the first and second write scan lines SWL1 and SWL2. Furthermore, pixels in a second row may be connected to the second initialization scan line SIL2, the second compensation scan line SCL2, and the second and third write scan lines SWL2 and SWL3.

The plurality of sensors FX may be connected with the initialization scan lines SIL1 to SILn, the compensation scan lines SCL1 to SCLn, and the readout lines RL1 to RLm. Each of the plurality of sensors FX may be electrically connected with two scan lines. For example, as illustrated in FIG. 3, the sensors FX in the first row may be connected with the first initialization scan line SIL1 and the first compensation scan line SCL1. In addition, the sensors FX in a second row may be connected with the second initialization scan line SIL2 and the second compensation scan line SCL2.

The scan driver 300 may be disposed in the non-display region NDA of the display panel DP. The scan driver 300 receives the first control signal SCS from the driving controller 100. The first control signal SCS may include a starting signal and a plurality of clock signals. The scan driver 300 may output initialization scan signals to the initialization scan lines SIL1 to SILn in response to the first control signal SCS, may output compensation scan signals to the compensation scan lines SCL1 to SCLn, and may output write scan signals to the write scan lines SWL1 to SWLn+1.

The light emitting driver 350 may be disposed in the non-display region NDA of the display panel DP. The light emitting driver 350 receives the second control signal ECS from the driving controller 100. The light emitting driver 350 may output light emitting control signals to the light emitting control lines EML1 to EMLn in response to the second control signal ECS. Alternatively, the scan driver 300 may be connected with the light emitting control lines EML1 to EMLn. In this case, the scan driver 300 may output the light emitting control signals to the light emitting control lines EML1 to EMLn.

The readout circuit 500 receives the fourth control signal RCS from the driving controller 100. The readout circuit 500 may receive sensing signals from the readout lines RL1 to RLm in response to the fourth control signal RCS. The readout circuit 500 may process the sensing signals received from the readout lines RL1 to RLm and may provide processed sensing signals S_FS to the driving controller 100. The driving controller 100 may recognize biometric information based on the sensing signals S_FS.

Figure 4:
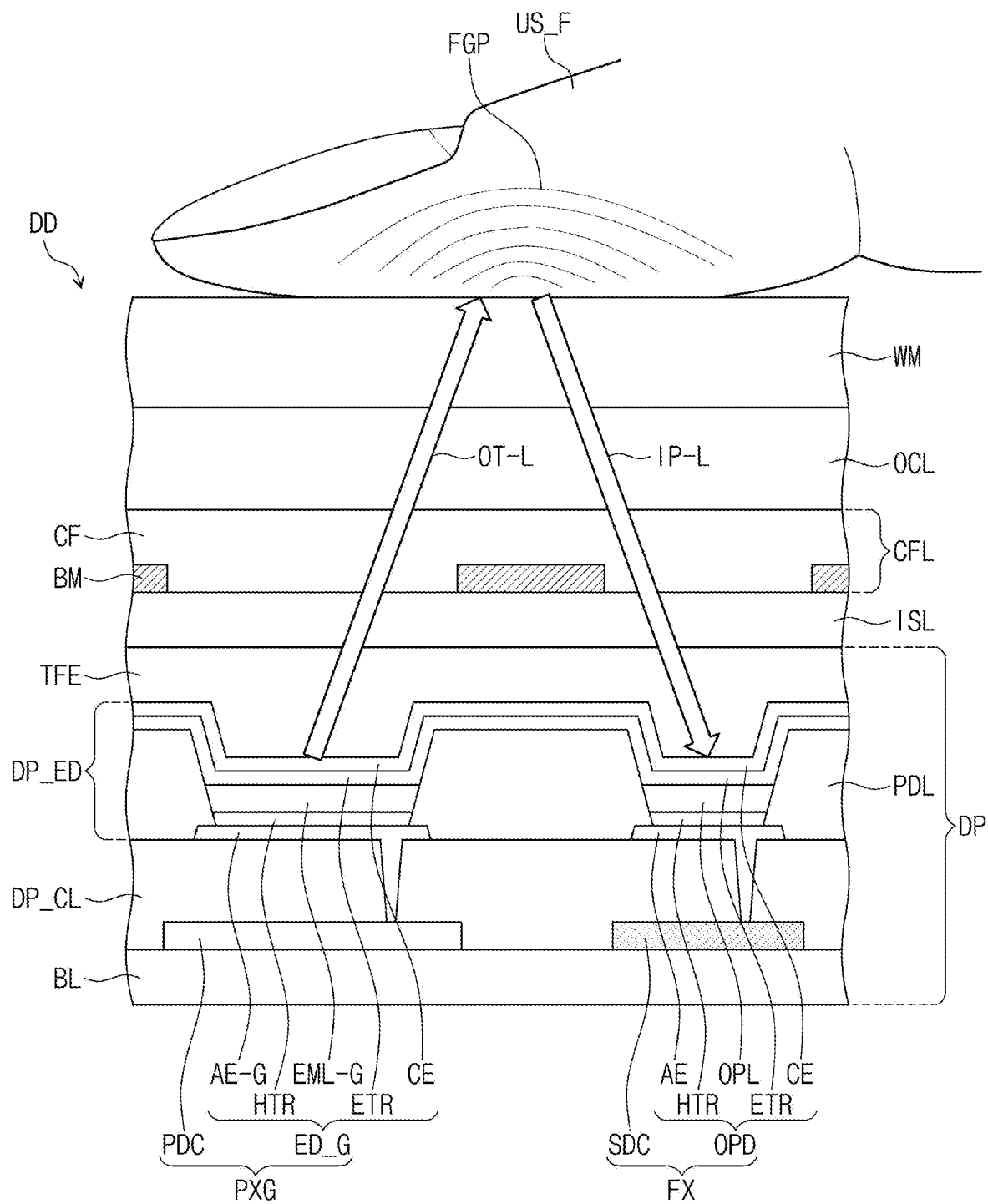
FIG. 4 is a cross-sectional view of a display device according to an embodiment of the present disclosure.

FIG. 4 is a cross-sectional view of a display device according to an embodiment of the present disclosure. FIG. 4 illustrates a state of recognizing a fingerprint FGP, which is one of biometric information input through the hand US_F of a user.

In FIG. 4, according to an embodiment, light OT-L emitted from a green light emitting device (or a light emitting device) ED_G included in the display layer DP_ED of the display device DD is reflected, in the form of a reflective light IP-L, from an external object (for example, a fingerprint FGP according to an embodiment) and may be incident to a photo-detector OPD included in the display layer DP_ED. The reflective light IP-L incident to the photo-detector OPD may be a light in a visible band. The photo-detector OPD may receive the incident light, may convert the incident light into an electrical signal, may recognize the external input, and may change the driving state of the display device DD. In the following description to be made with reference to FIG. 4, the duplication of the description made with reference to FIG. 2 may be omitted.

Referring to FIG. 4, the display layer DP_ED may be disposed on the circuit layer DP_CL. The display layer DP_ED may include light emitting devices ED_R, ED_G, and ED_B (see FIG. 6A), and the photo-detector OPD. FIG. 4 representatively illustrates only the green light emitting device ED_G. A portion, which is common with the description of the green light emitting device ED_G, of the descriptions of the red light emitting device ED_R and the blue light emitting device ED_B, will be made with reference to the description of the green light emitting device ED_G. Hereinafter, the light emitting device includes the green light emitting device ED_G, the red light emitting device ED_R, and the blue light emitting device ED_B. For example, the light emitting devices ED_R, ED_G, and ED_B included in the display layer DP_ED may include an organic light emitting device, a quantum dot light emitting device, a micro light emitting diode (LED) light emitting device, or a nano LED light emitting device. However, an embodiment is not limited thereto. For example, the light emitting devices ED_R, ED_G, and ED_B may include various embodiments, as long as light is emitted or a quantity of light is controlled in response to the electrical signal.

The photo-detector OPD may be a light sensor which receives and recognizes light reflected from an external object. For example, the photo-detector OPD may be a light sensor that recognizes light in the visible band, which is reflected from the external object. According to an embodiment, the photo-detector OPD may be a biometric sensor that recognizes light reflected from a body part, such as a fingerprint or vein, of a user and converts an optical signal into an electrical signal.

The display layer DP_ED may include a pixel defining layer PDL, and the light emitting devices ED_R, ED_G, and ED_B may be separated from the photo-detector OPD by the pixel defining layer PDL.

The pixel defining layer PDL may be disposed on the base layer BL. The pixel defining layer PDL may be disposed on the circuit layer DP_CL and may expose a portion of a top surface of a first electrode AE-G through an opening.

According to an embodiment, the pixel defining layer PDL may be formed of a polymer resin. For example, the pixel defining layer PDL may include a polyacrylate-based resin or a polyimide-based resin. In addition, the pixel defining layer PDL may further include an inorganic material in addition to the polymer resin. The pixel defining layer PDL may include a light absorbing material or may include a black pigment or a black dye. The pixel defining layer PDL including the black pigment or black dye may implement a black pixel defining layer. When the pixel defining layer PDL is formed, carbon black may be used as the black pigment or the black dye. However, an embodiment is not limited thereto.

In addition, the pixel defining layer PDL may be formed of an inorganic material. For example, the pixel defining layer PDL may include silicon nitride (SiNx), silicon oxide (SiOx), or silicon oxynitride (SiOxNy).

The light emitting device ED_G may include the first electrode AE-G, a second electrode CE, and a light emitting layer EML-G. In the specification, the first electrode AE-G constituting the light emitting device ED_G may be referred to as a light emitting electrode. According to an embodiment, the display layer DP_ED may include the red light emitting device ED_R (see FIG. 6A) disposed to correspond to a red light emitting region to emit red light, the green light emitting device ED_G disposed to correspond to a green light emitting region to emit green light, and the blue light emitting device ED_B disposed to correspond to a blue light emitting region to emit blue light.

The photo-detector OPD may include a first electrode AE, a second electrode CE, and a photo-electric converting layer OPL. The first electrode AE may be exposed through the opening in the pixel defining layer PDL. In the display layer DP_ED, the first electrode AE-G or AE may include a metal material, a metal alloy, or a conductive compound. The first electrode AE-G or AE may be an anode or a cathode. However, an embodiment is not limited thereto. The first electrode AE-G or AE may a pixel electrode or a sensing electrode. The first electrode AE-G or AE may be a transmissive electrode, a transflective electrode, or a reflective electrode. When the first electrode AE-G or AE is a transmissive electrode, the first electrode AE-G or AE may include a transparent metal oxide, such as indium tin oxide (ITO), indium zinc oxide (IZO), zinc oxide (ZnO), or indium tin zinc oxide (ITZO). When the first electrode AE-G or AE is the transflective electrode or the reflective electrode, the first electrode AE-G or AE may include Ag, Mg, Cu, Al, Pt, Pd, Au, Ni, Nd, Ir, Cr, Li, Ca, LiF/Ca, LiF/Al, Mo, Ti, W or a compound or mixture thereof (e.g., a mixture of Ag and Mg).

The second electrode CE may be a common electrode. The second electrode CE may be a cathode or an anode, but an embodiment is not limited thereto. For example, when the first electrode AE-G or AE is an anode, the second electrode CE may be a cathode. When the first electrode AE-G or AE is the cathode, the second electrode CE may be the anode.

The second electrode CE may be a transmissive electrode, a transflective electrode, or a reflective electrode. When the second electrode CE is a transmissive electrode, the second electrode CE may include a transparent metal oxide, such as indium tin oxide (ITO), indium zinc oxide (IZO), zinc oxide (ZnO), or indium tin zinc oxide (ITZO). When the second electrode CE is a transflective electrode or a reflective electrode, the second electrode CE may include Ag, Mg, Cu, Al, Pt, Pd, Au, Ni, Nd, Ir, Cr, Li, Ca, LiF/Ca, LiF/Al, Mo, Ti, Yb, W or a compound or mixture (e.g., AgMg, AgYb, or MgAg) including the above-described element.

According to an embodiment, the first electrode AE-G or AE included in the display layer DP_ED is a transflective electrode or a reflective electrode. The second electrode CE may be a transmissive electrode or a transflective electrode. In other words, according to an embodiment, as the second electrode CE in the transmissive type or transflective type is employed, light reflected from an external object may be easily transmitted to the photo-detector OPD.

The light emitting layer EML-G of the light emitting device ED_G may be interposed between the first electrode AE-G and the second electrode CE. The light emitting layer EML-G may include an organic light emitting material or may include a quantum dot material.

The light emitting device ED_G may include a hole transport region HTR and an electron transport region ETR. The hole transport region HTR may be interposed between the first electrode AE-G and the light emitting layer EML-G. The electron transport region ETR may be interposed between the light emitting layer EML-G and the second electrode CE.

The photo-detector OPD may be interposed between the first electrode AE and the second electrode CE and may include the photo-electric converting layer OPL. The photo-electric converting layer OPL may include a light receiving material for receiving light to convert the light in an electrical signal. For example, according to an embodiment, the photo-electric converting layer OPL may include an organic light receiving material. In an embodiment, the photo-electric converting layer OPL may include an organic polymer material serving as a light receiving material. For example, the photo-electric converting layer OPL may include a conjugated polymer. The photo-electric converting layer OPL may include a thiophene-based conjugated polymer, a benzodithiophene-based conjugated polymer, a thieno [3,4-c] pyrrole-4,6-dione (TPD)-based conjugated polymer, a diketo-pyrrole-pyrrole (DPP)-based conjugated polymer, or a benzothiadiazole (BT)-based conjugated polymer. However, an embodiment is not limited thereto.

The photo-detector OPD may include the hole transport region HTR and the electron transport region ETR. The hole transport region HTR may be interposed between the first electrode AE and the photo-electric converting layer OPL. The electron transport region ETR may be interposed between the photo-electric converting layer OPL and the second electrode CE.

According to an embodiment, the hole transport region HTR constituting the light emitting device ED_G and the photo-detector OPD may have a single layer including a single material, a single layer including a plurality of different materials, and a plurality of layers including a plurality of different materials. For example, the hole transport region HTR may have a single-layer structure of a hole injection layer or a hole transport layer and may have a single-layer structure including a hole injection material and a hole transport material. According to an embodiment, the hole transport region HTR, which is included in the green light emitting device ED_G and the photo-detector OPD, may include a hole transport layer, and may further include a hole injection layer.

According to an embodiment, the electron transport region ETR constituting the light emitting device ED_G and the photo-detector OPD may have a single layer including a single material, a single layer including a plurality of different materials, or a plurality of layers including a plurality of different materials.

For example, the electron transport region ETR may have a single-layer structure of an electron injection layer or an electron transport layer and may have a single-layer structure composed of an electron injection material and an electron transport material. In addition, the electron transport region ETR may have a structure of a single layer including a plurality of different materials, or may further include a plurality of layers that are sequentially stacked from the light emitting layer EML-G. According to an embodiment, the electron transport region ETR included in the green light emitting device ED_G and the photo-detector OPD may include an electron transfer layer and may further include an electron injection layer.

Referring to FIG. 4, according to an embodiment, the hole transport region HTR may be disposed on the light emitting layer EML-G of the light emitting device ED_G or the photo-electric converting layer OPL of the photo-detector OPD. The hole transport region HTR may be separated by the pixel defining layer PDL. In addition, according to an embodiment, the electron transport region ETR may be provided in one common layer. The electron transport region ETR may be provided in a common layer throughout the entire portions of the light emitting device ED_G and the photo-detector OPD. The electron transport region ETR may be overlapped with all of the pixel defining layer PDL, the light emitting layer EML-G, and the photo-electric converting layer OPL.

The color filter layer CFL may include filter parts CF and a light blocking part BM. The filter parts CF may include a red filter part, a green filter part, and a blue filter part. The red filter part, the green filter part, and the blue filter part may be positioned to correspond to the red light emitting region, the green light emitting region, and the blue light emitting region, respectively. The green filter part may be overlapped with the green light emitting device ED_G and the photo-detector OPD.

The filter parts CF may transmit red light, green light, and blue light. The filter parts CF may include a polymer photosensitive resin, and a pigment or dye.

The light blocking part BM may be disposed on the input sensing layer ISL and may be overlapped with the boundary between adjacent filter parts CF. The light blocking part BM may prevent light leakage and may identify the boundary between adjacent color filter parts CF. The light blocking part BM may also overlap the pixel defining layer PDL.

The light blocking part BM may be a black matrix. The light blocking part BM may include an organic pigment or a dye. The light blocking part BM may include an organic light blocking material or an inorganic light blocking material, which includes a black pigment or a black dye. The light blocking part BM may be formed based on a light blocking composition including propylene glycol monomethyl ether acetate, 3-methoxybutyl acetate, or an organic black pigment.

The color filter layer CFL may further overlapped by an overcoating layer OCL. The overcoating layer OCL may include an organic insulating material. The overcoating layer OCL may be provided with a thickness sufficient to remove a step difference between the filter parts CF. A material of the overcoating layer OCL may not be particularly limited, as long as the material is used to planarize the top surface of the color filter layer CFL, and has a specific thickness. For example, the material may include an acrylate-based organic material.

The circuit layer DP_CL may be connected to the display layer DP_ED to drive the light emitting device ED_G and the photo-detector OPD in the display layer DP_ED. Referring to FIG. 4, the circuit layer DP_CL may include a pixel driving part PDC and a sensor driving part SDC. The light emitting device ED_G and the pixel driving part PDC may constitute a pixel PXG, and the photo-detector OPD and the sensor driving part SDC may constitute the sensor FX.

The pixel driving part PDC may include a pixel driving circuit electrically connected to the light emitting device ED_G to drive the light emitting device ED_G. The pixel driving part PDC may be connected to the light emitting device ED_G one to one. In other words, one pixel driving part PDC is connected to one light emitting device ED_G, and another pixel driving part is connected to another light emitting device. The light emitting device ED_G may be an organic light emitting diode. The pixel driving circuit will be described in detail with reference to FIG. 10.

The sensor driving part SDC may include a sensor driving circuit electrically connected to the photo-detector OPD to drive the photo-detector OPD. The sensor driving part SDC may be connected to the photo-detector OPD one to one or one to two. In other words, the sensor driving part SDC may be connected to one photo-detector OPD or two photo-detectors OPD. The details thereof will be described below with reference to FIG. 5 to FIG. 9. In this case, the photo-detector OPD may include an organic photo-diode. According to an embodiment, two photo-detectors OPD (e.g., 'n' number photo-detectors OPD) may be connected to one sensor driving part SDC. The sensor driving circuit will be described in detail with reference to FIG. 10.

A plurality of photo-detectors OPD may be provided to correspond to the number of light emitting devices ED_G. A plurality of sensor driving parts SDC may be provided to correspond to the number of photo-detectors OPD. The circuit layer DP_CL may provide a confined space in which the plurality of pixel driving parts PDC and the plurality of sensor driving parts SDC are arranged. The details thereof will be described with reference to FIG. 5.

Figure 5:
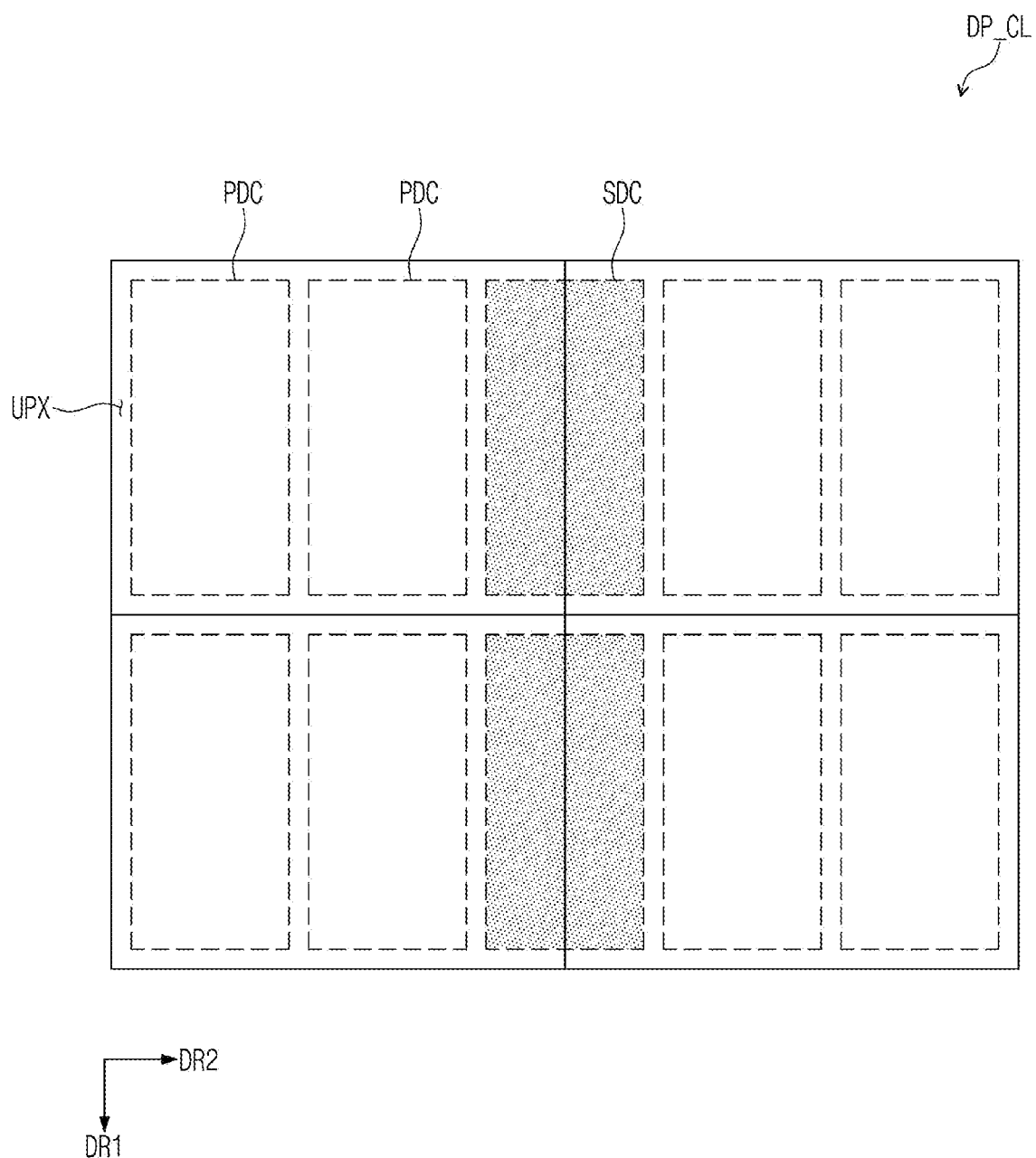
FIG. 5 is a plan view of a circuit layer according to an embodiment of the present disclosure.

FIG. 5 is a plan view of a circuit layer according to an embodiment of the present disclosure.

Referring to FIG. 5, a plurality of unit pixel regions UPX are provided in the circuit layer DP_CL, and the pixel driving part PDC and the sensor driving part SDC may be disposed in the unit pixel region UPX.

According to an embodiment, when viewed in a plan view, the space, in which the pixel driving part PDC and the sensor driving part SDC are disposed, may be restrictively provided in the circuit layer DP_CL. In the confined space of the circuit layer DP_CL, the plurality of pixel driving parts PDC may be disposed in proportion to the number of pixels PX (see FIG. 2). The number of sensor driving parts SDC may be increased, as the number of the sensors FX (see FIG. 2) is increased.

According to the present embodiment, in the circuit layer DP_CL, the region occupied by the pixel driving part PDC may be wider than the region occupied by the sensor driving part SDC. In other words, as the number of photo-detectors OPD is increased, the region occupied by the sensor driving part SDC may be increased. For example, the unit pixel in the unit pixel region UPX may include the pixel PX and the sensor FX. The pixel PX may include a plurality of light emitting devices ED_R, ED_G, and ED_B, and the sensor FX may include a plurality of photo-detectors OPD. In general, when two photo-detectors OPD are provided in the unit pixel region UPX, since two sensor driving parts SDC are necessary, the region occupied by the sensor driving part SDC may be increased. However, referring to FIGS. 5 to 9, according to an embodiment of the present disclosure, since two adjacent photo-detectors OPD share one sensor driving part SDC with each other, the region occupied by the sensor driving part SDC is not increased in the circuit layer DP_CL.

According to an embodiment, two pixel driving parts PDC may be disposed in one unit pixel region UPX. The pixel driving parts PDC may be connected to relevant pixels of the plurality of pixels PXR, PXG, and PXB.

One sensor driving part SDC may be disposed in two unit pixel regions UPX. In other words, in the following description made with reference to FIGS. 8A and 9, two photo-detectors OPD, each disposed in mutually different unit pixel regions UPX, may share one sensor driving part SDC. Alternatively, in the following description made with reference to FIGS. 6A to 7, one photo-detector OPD and one sensor driving part SDC, which are disposed in two adjacent unit pixel regions UPX, may be connected to each other one to one.

According to an embodiment, the sensor driving part SDC may be interposed between two adjacent unit pixel regions UPX, when viewed in a plan view. The sensor driving part SDC may be overlapped with both two unit pixel regions UPX. For example, the sensor driving part SDC may be interposed between two pixel driving parts PDC disposed in the two adjacent unit pixel regions UPX in the second direction DR2.

Figure 6A:
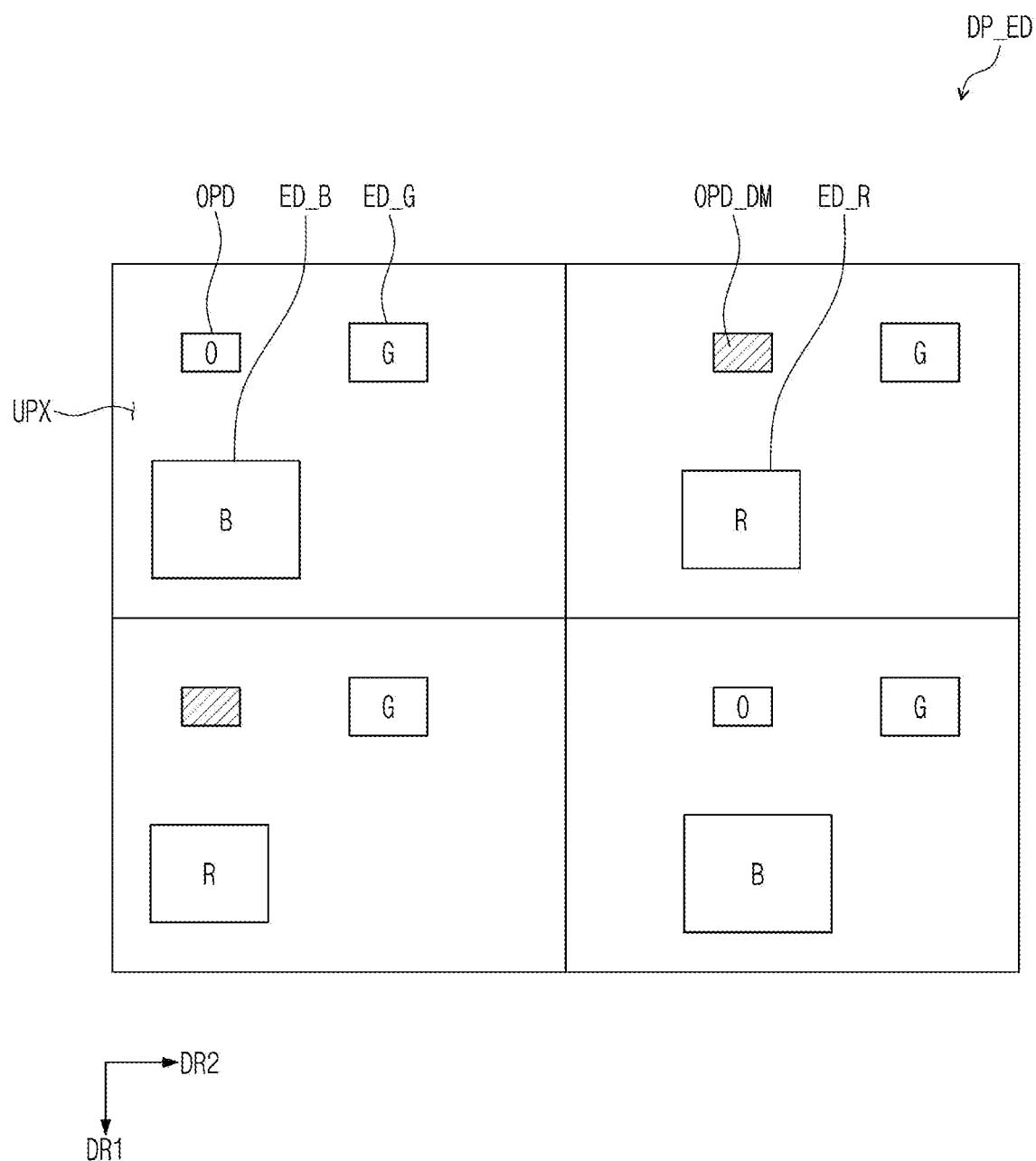
FIGS. 6A and 6B are plan views of a display device according to an embodiment of the present disclosure.
Figure 6B:
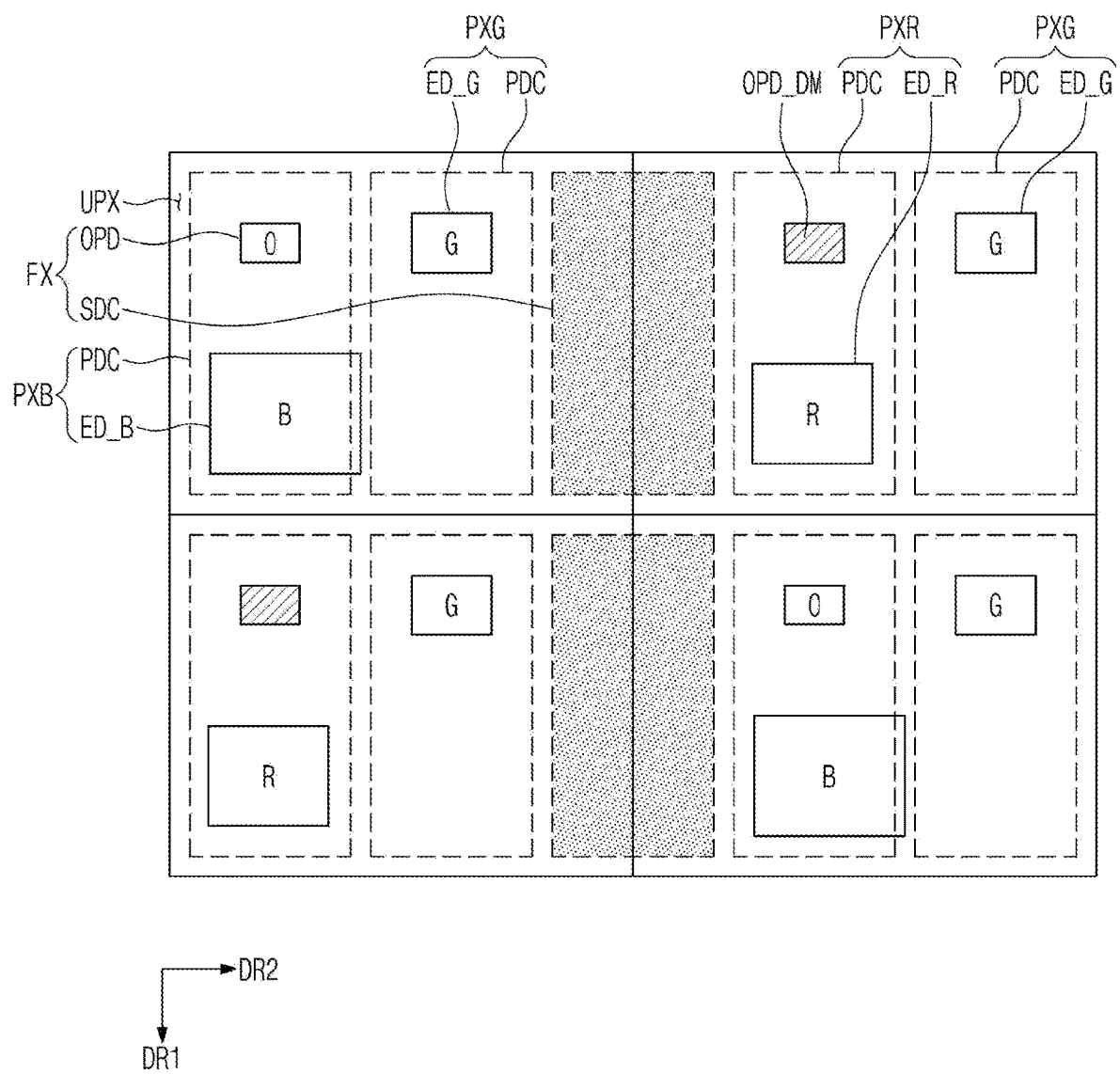
Figure 7:
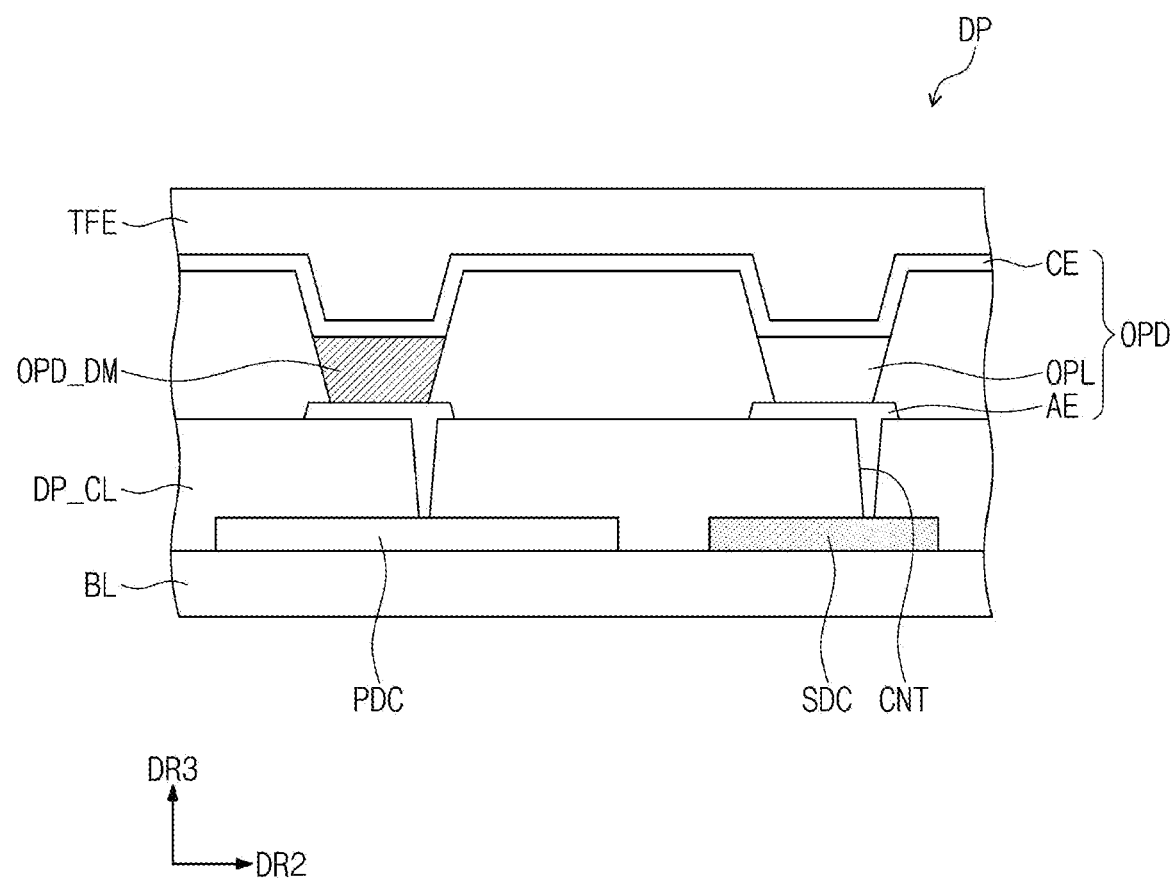
FIG. 7 is a plan view of a display device according to an embodiment of the present disclosure.

FIGS. 6A and 6B are plan views of a display device according to an embodiment of the present disclosure. FIG. 7 is a cross-sectional view of a display device according to an embodiment of the present disclosure. FIG. 6A illustrates the display layer DP_ED according to an embodiment. FIG. 6B illustrates the display layer DP_ED and the circuit layer DP_CL.

In FIG. 6A, at least one light emitting device ED_R, ED_G, or ED_B may be disposed inside one unit pixel region UPX of the display layer DP_ED. One photo-detector OPD or dummy device OPD_DM may be selectively disposed inside one unit pixel region UPX of the display layer DP_ED.

According to an embodiment, the photo-detector OPD may be disposed in any one of two adjacent unit pixel regions UPX of the plurality of unit pixel regions UPX, and the dummy device OPD_DM may be disposed in another one of the two adjacent unit pixel regions UPX.

Referring to FIGS. 6B and 7, the photo-detector OPD disposed in any one of the two adjacent unit pixel regions UPX in the display layer DP_ED may be electrically connected to one sensor driving part SDC disposed across the two adjacent two unit pixel regions UPX in the circuit layer DP_CL.

Referring to FIGS. 6A and 6B, the display panel DP includes the pixels PXR, PXG, and PXB, and sensors FX. Each of the pixels PXR, PXG, and PXB includes the light emitting devices ED_R, ED_G, and ED_B, and the pixel driving part PDC. Each of the sensors FX includes the photo-detector OPD, the dummy device OPD_DM, and the sensor driving part SDC. In this case, the dummy device OPD_DM may correspond to a floating device disposed to correspond to the photo-detector OPD in the pixels PXR, PXG, and PXB.

The dummy device OPD_DM may be a device which floats and does not perform any function. For example, the dummy device OPD_DM may not be electrically connected to another device. Accordingly, the dummy device OPD_DM may be disposed in an area corresponding to where the photo-detector OPD would be disposed. The dummy device OPD_DM may have the size equal to the size of the photo-detector OPD, and may be patterned, which is similar to the photo-detector OPD. The number of dummy devices OPD_DM may be equal to the number of the photo-detectors OPD. For example, at least one photo-detector OPD or dummy device OPD_DM may be disposed inside one unit pixel region UPX. In other words, the photo-detector OPD and the dummy device OPD_DM disposed inside one unit pixel region UPX may be equal to each other in number. For example, one photo-detector OPD may be disposed in a first unit pixel region UPX and one dummy device OPD_DM may be disposed in a second unit pixel region UPX.

In FIG. 6B, the pixels PXR, PXG, and PXB in the display layer DP_ED may be disposed inside the unit pixel region UPX, respectively. The pixels PXR, PXG, and PXB may be disposed to be adjacent to the pixel driving part PDC in the circuit layer DP_CL. The pixels PXR, PXG, and PXB are electrically connected to the pixel driving part PDC. However, the pixels PXR, PXG, and PXB do not need to be adjacent to the pixel driving part PDC. In other words, the pixels PXR, PXG, and PXB may be spaced apart from the pixel driving part PDC.

The photo-detector OPD in the display layer DP_ED may be electrically connected to the sensor driving part SDC in the circuit layer DP_CL. The photo-detector OPD may be disposed to be adjacent to the sensor driving part SDC, but the present disclosure is not limited thereto. The sensor driving part SDC may not be adjacent to the sensor driving part SDC. As an example, the photo-detector OPD may be closer to the pixel driving part PDC.

The dummy device OPD_DM may be adjacent to the sensor driving part SDC or the pixel driving part PDC.

The pixels PXR, PXG, and PXB may be overlapped with the pixel driving part PDC, in the thickness direction of the display panel DP. Even the photo-detector OPD and the dummy device OPD_DM may be overlapped with the pixel driving part PDC. In other words, as the number of the sensor driving part SDC is decreased, the region occupied by the pixel driving part PDC may be increased. As the region occupied by the pixel driving part PDC is increased in the circuit layer DP_CL, the resolution of the display panel DP (see FIG. 2) may be improved.

The pixels PXR, PXG, and PXB and the sensors FX may be alternately disposed in the first direction DR1, and alternately disposed in the second direction DR2. The pixels PXR, PXG, and PXB include first pixels PXR including a light emitting device (hereinafter, the first light emitting device ED_R) to output light in a first color (for example, red R), second pixels PXG including a light emitting device (hereinafter, the second light emitting device ED_G) to output light in a second color (for example, green G), and third pixels PXB including a light emitting device (hereinafter, the third light emitting device ED_B) to output light in a third color (for example, blue B).

In FIGS. 6A and 6B, the first pixels PXR and the third pixels PXB may be alternately and repeatedly arranged in each of the first and second directions DR1 and DR2. The second pixels PXG may be arranged in the first direction DR1 and the second direction DR2.

The sensor FX may be interposed between the first pixel PXR and the third pixel PXB adjacent to each other in each of the first and second directions DR1 and DR2. In addition, the sensor FX may be interposed between two second pixels PXG in each of the first and second directions DR1 and DR2.

FIGS. 6A and 6B illustrate the arrangement structure of pixels PX and sensors FX per unit pixel region UPX, and the number of pixels PX and the number of sensors FX per unit pixel region UPX. In FIGS. 6A and 6B, two light emitting devices ED_R and ED_G, and one photo-detector OPD or one dummy device OPD_DM may be disposed in one unit pixel region UPX, and two pixel driving parts PDC and one sensor driving part SDC or less may be disposed in one unit pixel region UPX. The structure illustrated in FIGS. 6A and 6B are provided only for illustrative purposes, and the arrangement structure of the pixels PX and the sensors FX is not limited thereto.

The number of pixels PX and the number of sensors FX are not limited in the unit pixel region UPX. For example, one sensor FX may be disposed in each of the unit pixel regions UPX. In this case, any one of the sensors FX in the unit pixel region UPX adjacent to each other may include the photo-detector OPD and another one of the sensors FX of the unit pixel region UPX may include the dummy device OPD_DM.

The arrangement structure of the pixels PX and the sensors FX may be variously modified. For example, the first pixels PXR and the third pixels PXB may be disposed in mutually different columns or in mutually different rows. When the first pixels PXR are disposed in an odd-numbered column, the third pixels PXB may be disposed in an even-numbered column. When the first pixels PXR are disposed in an odd-numbered row, the third pixels PXB may be disposed in an even-numbered row. In this case, at least one second pixel PXG and at least one sensor FX may be interposed between two first pixels PXR adjacent to each other in the first and second directions DR1 and DR2. In addition, at least one second pixel PXG and at least one sensor FX may be interposed between two third pixels PXB adjacent to each other in the first and second directions DR1 and DR2.

According to an embodiment of the present disclosure, the first light emitting device ED_R may have a size larger than the size of the second light emitting device ED_G. In addition, the third light emitting device ED_B may have a size larger than or equal to the size of the first light emitting device ED_R. However, sizes of the first to third light emitting devices ED_R, ED_G, and ED_B are not limited thereto, and may be variously modified and applied. For example, according to an embodiment of the present disclosure, the first to third light emitting devices ED_R, ED_G, and ED_B may have equal sizes.

In addition, although each of the first to third light emitting devices ED_R, ED_G, and ED_B has a rectangular shape by way of example, the present disclosure is not limited thereto. Each of the first to third light emitting devices ED_R, ED_G, and ED_B may be variously modified to have a polygonal shape, a circular shape, or an oval shape. As another example, the first to third light emitting devices ED_R, ED_G, and ED_B may have mutually different shapes. In other words, the second light emitting device ED_G may have a circular shape, and the first and third light emitting devices ED_R and ED_B may have a rectangular shape.

The photo-detector OPD may have a size smaller than sizes of the first and third light emitting devices ED_R and ED_B. According to an embodiment of the present disclosure, the photo-detector OPD may have a size smaller than or equal to a size of the second light emitting device ED_G. However, the size of the photo-detector OPD is not limited thereto, and may be variously modified.

For example, the ratio among the photo-detector OPD and the first to third light emitting devices ED_R, ED_G, and ED_B may satisfy ED_R:ED_G:ED_B:OPD=14:12:20:9.

Although the photo-detector OPD has a rectangular shape by way of example, the present disclosure is not limited thereto. For example, the photo-detector OPD may be variously modified to have a polygonal shape, a circular shape, or an oval shape.

Each of the first to third light emitting devices ED_R, ED_G, and ED_B is electrically connected to the relevant pixel driving part PDC. The pixel driving part PDC may include a plurality of transistors and a capacitor. The pixel driving parts PDC connected to the first to third light emitting devices ED_R, ED_G, and ED_B may have the same circuit configuration.

The photo-detector OPD is electrically connected to the relevant sensor driving part SDC. The sensor driving part SDC may include a plurality of transistors. According to an embodiment of the present disclosure, the sensor driving part SDC and the pixel driving part PDC may be simultaneously formed in the same process. In addition, the scan driver 300 may include transistors formed in the same process as those of the pixel driving part PDC and the sensor driving part SDC.

FIG. 7 is a cross-sectional view illustrating the display device of FIGS. 6A, and 6B according to an embodiment. In FIG. 7, the hole transport region HTR (see FIG. 4) and the electron transport region ETR (see FIG. 4) will be omitted.

In FIG. 7, the dummy device OPD_DM is floated. Accordingly, the dummy device OPD_DM is not connected to the first electrode AE and the second electrode CE. The dummy device OPD_DM may be disposed in the same layer as that of the photo-electric converting layer OPL. Since the dummy device OPD_DM is floated, the dummy device OPD_DM is not connected to the sensor driving part SDC and/or the pixel driving part PDC. The pixel driving part PDC may be disposed in the circuit layer DP_CL under the dummy device OPD_DM.

The photo-detector OPD may be electrically connected to the sensor driving part SDC through a contact hole CNT formed through the circuit layer DP_CL. The sensor driving part SDC may be formed under the photo-detector OPD. However, the present disclosure is not limited thereto. The sensor driving part SDC may be disposed to be prevented from being overlapped with the photo-detector OPD.

The sensor driving part SDC includes a sensor driving circuit, and the pixel driving part PDC includes a pixel driving circuit. The area of the sensor driving circuit may be less than the area of the pixel driving circuit. Accordingly, the area of the sensor driving part SDC may be less than the area of the pixel driving part PDC.

Referring to FIG. 3, the pixel driving part PDC receives the first driving voltage ELVDD, the second driving voltage ELVSS, and the first and second initialization voltages VINT1 and VINT2, from the voltage generator 400. The sensor driving part SDC receives, from the voltage generator 400, the first driving voltage ELVDD, the second driving voltage ELVSS, and the reset voltage VRST.

Figure 10:
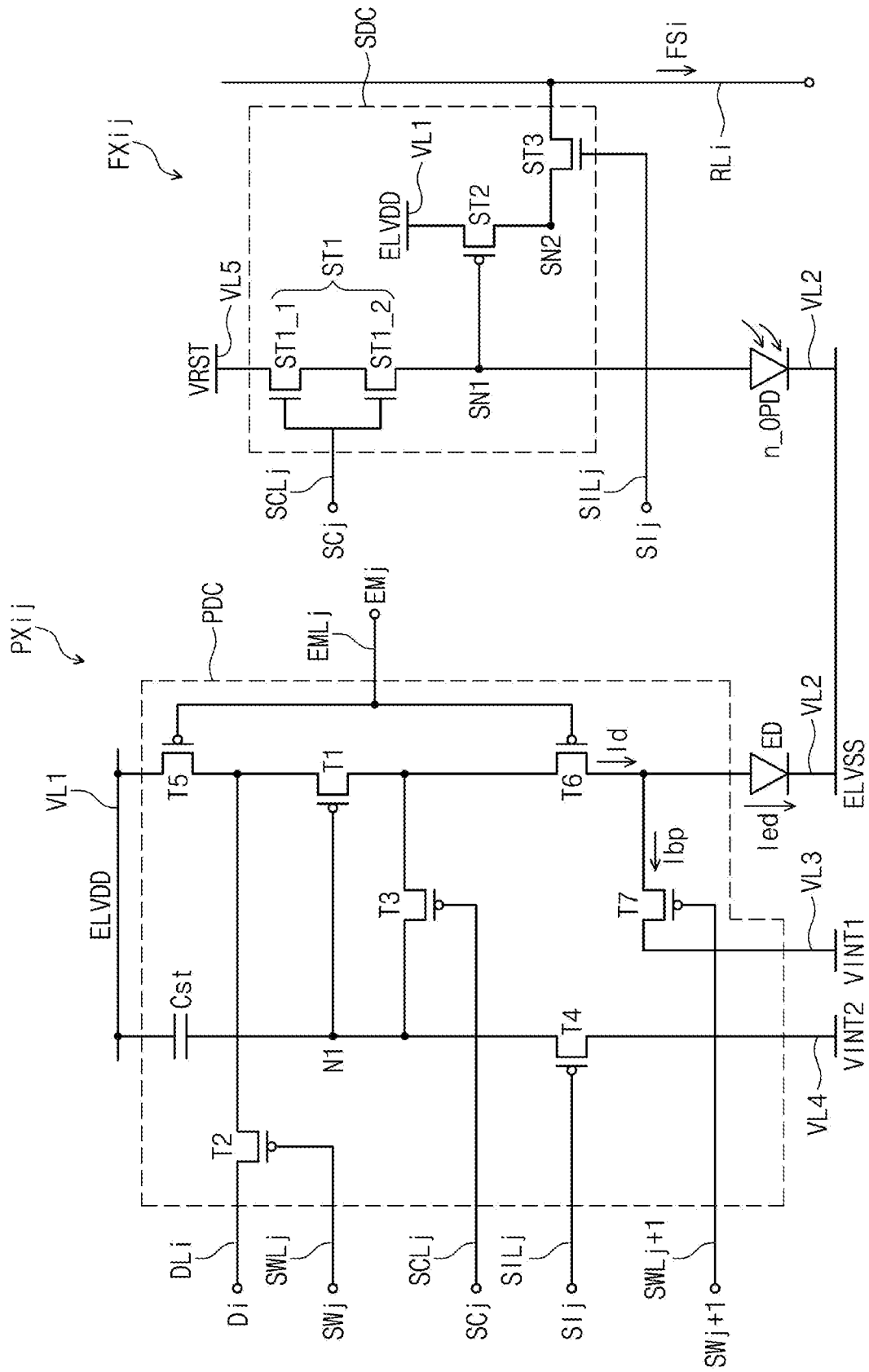
FIG. 10 is a circuit diagram illustrating a pixel driving circuit and a sensor driving circuit according to an embodiment of the present disclosure.

The circuit diagrams of the pixel driving part PDC and the sensor driving part SDC will be illustrated in FIG. 10.

Figure 8A:
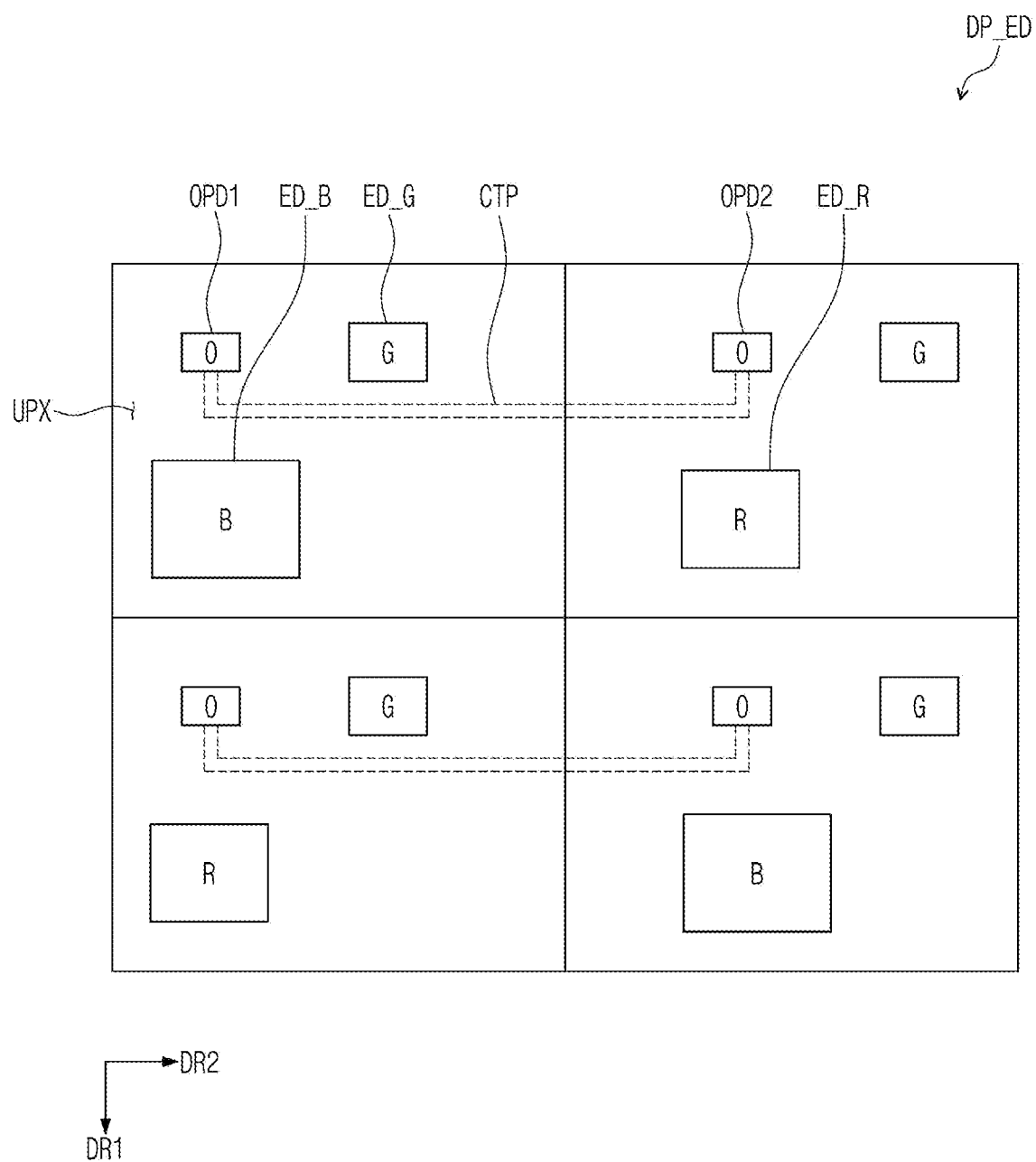
FIGS. 8A and 8B are plan views of a display device according to an embodiment of the present disclosure.
Figure 8B:
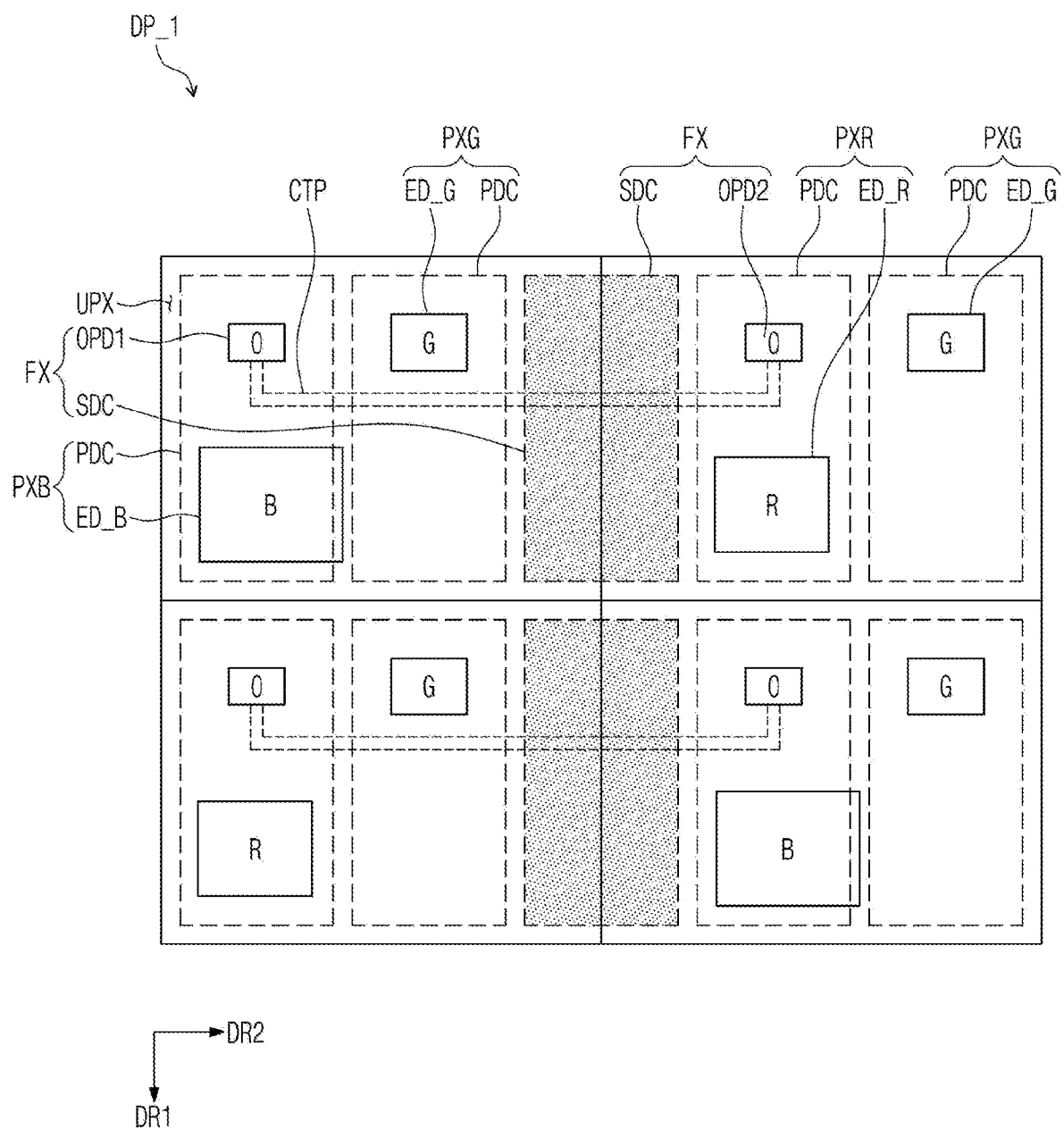
Figure 9:
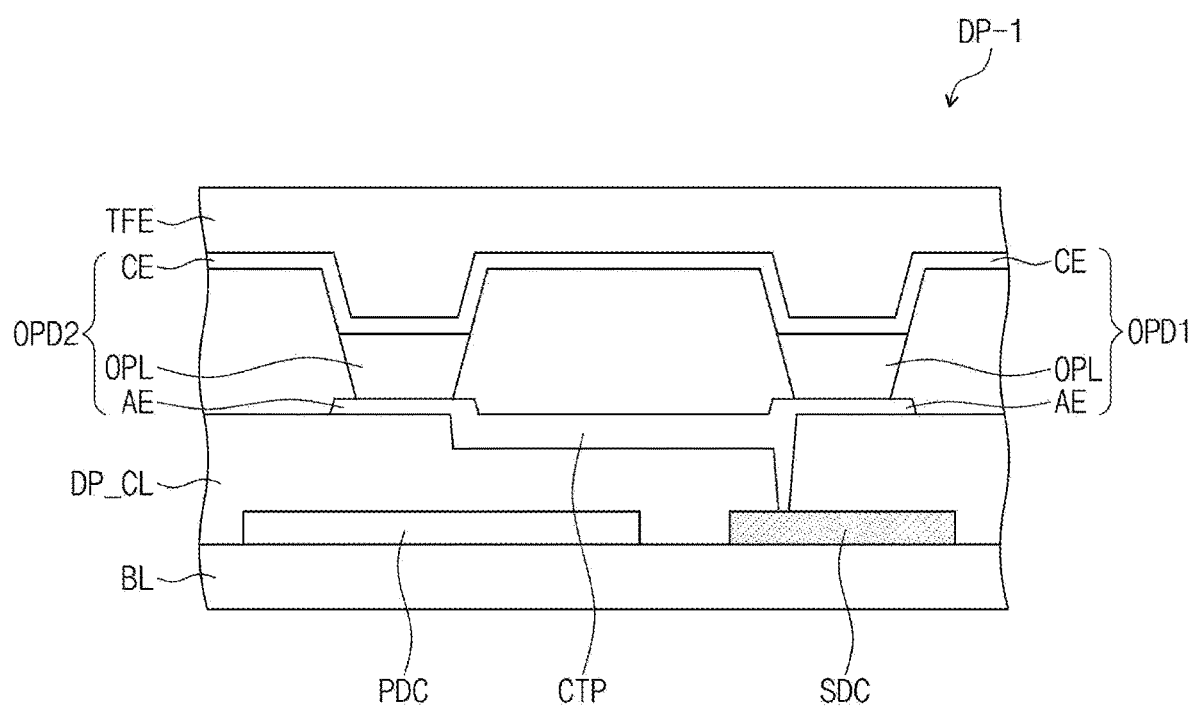
FIG. 9 is a cross-sectional view of a display device according to an embodiment of the present disclosure.

FIGS. 8A and 8B are plan views of a display device according to an embodiment of the present disclosure. FIG. 9 is a cross-sectional view of a display device according to an embodiment of the present disclosure.

FIGS. 8A and 8B illustrate plan views of a display device according to an embodiment, which are different from FIGS. 6A and 6B. In the following description made with reference to FIGS. 8A and 8B, the duplication of the description made with reference to FIGS. 6A and 6B may be omitted. The following description will be made while focusing on the difference from the embodiment described with reference to FIGS. 6A and 6B.

FIG. 8A illustrates a plan view of a display layer DP_ED, and FIG. 8B illustrates a plan view of a display panel DP-1 according to an embodiment. Referring to FIGS. 8A and 8B, at least one photo-detector OPD1 or OPD2 may be disposed in a unit pixel region UPX of the display panel DP-1. For example, the first and second photo-detectors OPD1 and OPD2 may be disposed in two adjacent unit pixel regions UPX, respectively. The first and second photo-detectors OPD1 and OPD2 may have equal sizes.

In FIG. 8A, two light emitting devices ED_G and ED_B and one first photo-detector OPD1 may be disposed in any one of two adjacent unit pixel regions UPX, and two light emitting devices ED_G and ED_R and one second photo-detector OPD2 may be disposed in another one of the two adjacent unit pixel regions UPX. According to an embodiment, the first and second photo-detectors OPD1 and OPD2 may be electrically connected to one sensor driving part SDC. In other words, one sensor driving part SDC may drive a plurality of photo-detectors (e.g., the first and second photo-detectors OPD1 and OPD2). The first and second photo-detectors OPD1 and OPD2 connected to the same sensor driving part SDC may be disposed in unit pixel regions UPX adjacent to each other in the second direction DR2.

One sensor driving part SDC connected to the first and second photo-detectors OPD1 and OPD2 may be disposed in any one unit pixel region UPX of the two adjacent unit pixel regions UPX or may be interposed between the two adjacent unit pixel regions UPX. FIG. 8B illustrates that the sensor driving part SDC is interposed between the two adjacent unit pixel regions UPX. For example, a first portion of the sensor driving part SDC may be located in one of the two adjacent pixel regions UPX and a second portion of the sensor driving part SDC may be located in the other of the two adjacent pixel regions UPX. The sensor driving part SDC may be disposed to be more adjacent to any one of the first and second photo-detectors OPD1 and OPD2 or may be interposed between the first and second photo-detectors OPD1 and OPD2, when viewed in a plan view.

FIG. 9 illustrates a cross-sectional view of a display device of FIGS. 8A and 8B according to an embodiment.

In FIG. 9, the first photo-detector OPD1 may be overlapped with the sensor driving part SDC in a thickness direction of the display panel DP-1. The second photo-detector OPD2 may be disposed to be overlapped with the pixel driving part PDC. Any one of the first and second photo-detectors OPD1 and OPD2 may be overlapped with the sensor driving part SDC and another one of the first and second photo-detectors OPD1 and OPD2 may be overlapped with the pixel driving part PDC. For example, the first photo-detector OPD1 may be disposed on the sensor driving part SDC and the second photo-detector OPD2 may be disposed on the pixel driving part PDC. The second photo-detector OPD2 may be connected to the sensor driving part SDC, which is disposed under the first photo-detector OPD1, together with the first photo-detector OPD1. In other words, the first and second photo-detectors OPD1 and OPD2 may be connected to the same sensor driving part SDC and may be driven by the sensor driving part SDC. For example, each of the first and second photo-detectors OPD1 and OPD2 may be electrically connected to the sensor driving part SDC via the first electrode AE.

According to an embodiment, the first photo-detector OPD1 and the second photo-detector OPD2 may be electrically connected to each other through a connection part CTP, which extends along the circuit layer DP_CL, and is connected to one sensor driving part SDC. The connection part CTP may connect the first electrode AE overlapping the pixel driving part PDC to the first electrode AE overlapping the sensor driving part SDC. The connection part CTP may be part of the first electrode AE and may be formed through the same process. The connection part CTP of FIG. 9 is provided only for illustrative purposes, and the first photo-detector OPD1 and the second photo-detector OPD2 may be separated from each other and may still be connected to one sensor driving part SDC. The first photo-detector OPD1, the second photo-detector OPD2, and the sensor driving part SDC may be electrically connected to each other using various connection techniques, as long as the first photo-detector OPD1, the second photo-detector OPD2, and the sensor driving part SDC are electrically connected to each other.

According to an embodiment, in the display panel DP-1, the space to be occupied by the pixel driving part PDC inside the circuit layer DP_CL is increased, since the display panel DP-1 does not require an additional sensor driving part for the second photo-detector OPD2 or the first photo-detector OPD1. Accordingly, the pixel driving part PDC may be increased, and the resolution of the display panel DP-1 may be increased.

According to an embodiment, the display device DD includes: a display layer DP_ED including a light emitting device ED_G, a photo-detector OPD, and a dummy device; and a circuit layer DP_CL including a pixel driving part PDC, which is connected to the light emitting device ED_G, and a sensor driving part SDC which is connected to the photo-detector OPD, wherein the light emitting device ED_G and the dummy device OPD_DM are overlapped with the pixel driving part PDC, and wherein the photo-detector OPD is overlapped with the sensor driving part SDC.

Figure 11:
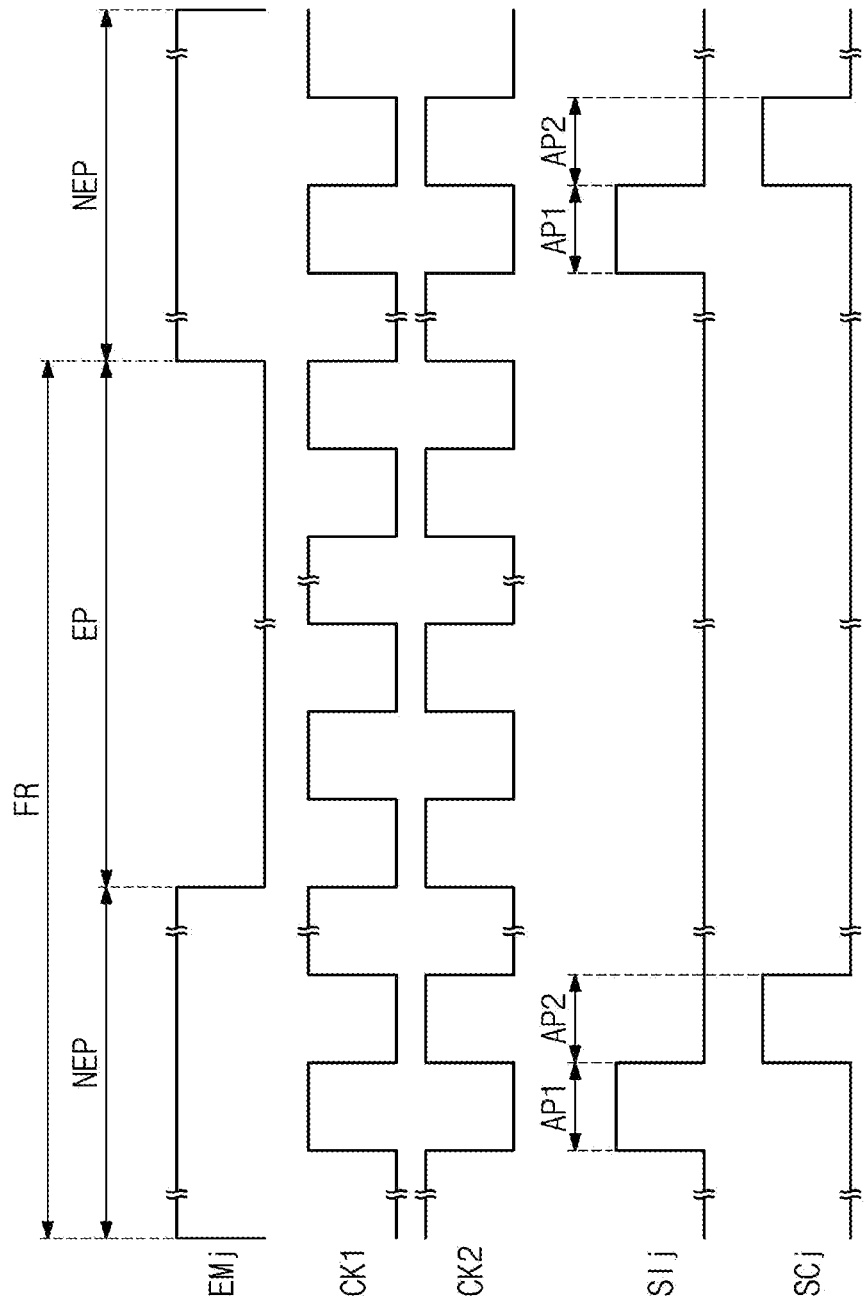

FIG. 10 is a circuit diagram illustrating a pixel driving circuit and a sensor driving circuit according to an embodiment of the present disclosure. FIG. 11 is a waveform diagram illustrating the operation of a sensor driving circuit illustrated in FIG. 10. The pixel driving circuit is included in the pixel driving part PDC, the sensor driving circuit is included in the sensor driving part SDC.

FIG. 10 illustrates an equivalent circuit diagram of one pixel PXij of the plurality of pixels PX illustrated in FIG. 3. Since the plurality of pixels PX have the same structure, additional description of the remaining pixels other than the pixel PXij will be omitted to avoid redundancy. In addition, an equivalent circuit diagram of one sensor FXij of the plurality of sensors FX illustrated in FIG. 3 is illustrated in FIG. 10 by way of example. Since, the plurality of sensors FX have the same structure, additional description of the remaining sensors other than the sensor FXij will be omitted to avoid redundancy.

Referring to FIG. 10, the pixel PXij is connected to an i-th data line DLi (hereinafter referred to as a "data line") among the data lines DL1 to DLm, a j-th initialization scan line SILj (hereinafter referred to as an "initialization scan line") among initialization scan lines SIL1 to SILn, a j-th compensation scan line SCLj (hereinafter referred to as a "compensation scan line") among compensation scan lines SCL1 to SCLn, j-th and (j+1)-th write scan lines SWLj and SWLj+1 (hereinafter referred to as "first and second write scan lines") among the write scan lines SWL1 to SWLn+1, and j-th light emitting control line EMLj (hereinafter referred to as an "light emitting control line") among the light emitting control lines EML1 to EMLn.

The pixel PXij includes the light emitting device ED and the pixel driving part PDC. The light emitting device ED may be a light emitting diode. According to an embodiment of the present disclosure, the light emitting device ED may be an organic light emitting diode including an organic light emitting layer.

The pixel driving part PDC includes first, second, third, fourth, fifth, sixth and seventh transistors T1, T2, T3, T4, T5, T6, and T7 and one capacitor Cst. The first to seventh transistors T1 to T7 may be P-type transistors. In addition, the first to seventh transistors T1 to T7 may be N-type transistors.

According to an embodiment, each of the first to seventh transistors T1 to T7 may be a transistor having a low-temperature polycrystalline silicon (LTPS) semiconductor layer. Some of the first to seventh transistors T1 to T7 may be P-type transistors, and the remaining transistors may be N-type transistors. For example, among the first to seventh transistors T1 to T7, the first, second, and fifth to seventh transistors T1, T2, and T5 to T7 are PMOS transistors, and the third and fourth transistors T3 and T4 may be NMOS transistors by using an oxide semiconductor as a semiconductor layer. According to an embodiment, at least one of the first to seventh transistors T1 to T7 may be N-type transistors and remaining transistors of the first to seventh transistors T1 to T7 may be P-type transistors. According to the present disclosure, the configuration of the pixel driving part PDC is not limited to the embodiment illustrated in FIG. 10. The pixel driving part PDC illustrated in FIG. 10 is provided for illustrative purposes, and the configuration of the pixel driving part PDC may be modified and replicated.

The initialization scan line SILj, the compensation scan line SCLj, the first and second write scan line SWLj and SWLj+1, and the light emitting control line EMLj may transmit, to the pixel PXij, a j-th initialization scan signal SIj (hereinafter, referred to as an "initialization scan signal"), a j-th compensation scan signal SCj (hereinafter, referred to as a compensation scan signal), j-th and (j+1)-th write scan signals SWj and SWj+1 (hereinafter, the first and second write scan signal), and a j-th light emitting control signal EMj (hereinafter, referred to as a "light emitting control signal"). The data line DLi transmits a data signal Di to the pixel PXij. The data signal Di may have a voltage level corresponding to the image signal RGB input to the display device DD (refer to FIG. 3).

Each of first and second driving voltage lines VL1 and VL2 may transmit the first driving voltage ELVDD and the second driving voltage ELVSS to the pixel PXij. In addition, first and second initialization voltage lines VL3 and VL4 may transmit the first initialization voltage VINT1 and the second initialization voltage VINT2 to the pixel PXij, respectively.

The first transistor T1 is connected between the first driving voltage line VL1, which is to receive the first driving voltage ELVDD, and the light emitting device ED. The first transistor T1 includes a first electrode connected to the first driving voltage line VL1 via a fifth transistor T5, a second electrode electrically connected to an anode of the light emitting device ED through a sixth transistor T6, and a third electrode connected to a first end of the capacitor Cst. The first transistor T1 may receive the data signal Di, which is transmitted through the data line DLi depending on the switching operation of the second transistor T2, and supply a driving current Id to the light emitting device ED.

The second transistor T2 is connected between the data line DLi and the first electrode of the first transistor T1. The second transistor T2 includes a first electrode connected to the data line DLi, a second electrode connected to the first electrode of the first transistor T1, and a third electrode connected to the first write scan line SWLj. The second transistor T2 may be turned on, in response to the first write scan signal SWj received through the first write scan line SWLj to transmit the data signal Di, which is received through the data line DLi, to the first electrode of the first transistor T1.

The third transistor T3 is connected between the second electrode of the first transistor T1 and a first node N1. The third transistor T3 includes a first electrode connected to the third electrode of the first transistor T1, a second electrode connected to the second electrode of the first transistor T1, and a third electrode connected to the compensation scan line SCLj. As shown in FIG. 10, the first and third transistors T1 and T3 may be directly connected to the first node N1. The third transistor T3 may be turned on, in response to the compensation scan signal SCj received through the compensation scan line SCLj to connect the third electrode and the second electrode of the first transistor T1, such that the first transistor T1 is diode-connected.

The fourth transistor T4 is connected between the second initialization voltage line VL4, to which the second initialization voltage VINT2 is applied, and the first node N1. The fourth transistor T4 is directly connected to the first node N1 along with the first and third transistors T1 and T3. The fourth transistor T4 includes a first electrode connected to the third electrode of the first transistor T1, a second electrode connected to the second initialization voltage line VL4 to receive the second initialization voltage VINT2, and a third electrode connected to the initialization scan line SILj. The fourth transistor T4 is turned on, in response to the initialization scan signal SIj to receive the initialization scan line SILj. The fourth transistor T4, which is turned on, transmits the second initialization voltage VINT2 to the third electrode of the first transistor T1 to initialize the potential (e.g., the potential at the node N1) of the third electrode of the first transistor T1.

The fifth transistor T5 includes a first electrode connected to the first driving voltage line VL1, a second electrode connected to the first electrode of the first transistor T1, and a third electrode connected to the light emitting control line EMLj. The fifth transistor T5 may be referred to as a first light emitting control transistor.

The sixth transistor T6 includes a first electrode connected to the second electrode of the first transistor T1, a second electrode connected to the anode of the light emitting device ED, and a third electrode connected to the light emitting control line EMLj. The sixth transistor T6 may be referred to as a second light emitting control transistor.

The fifth transistor T5 and the sixth transistor T6 are simultaneously turned on, in response to the light emitting control signal EMj received through the light emitting control line EMLj. The first driving voltage ELVDD applied through the turned-on fifth transistor T5 may be compensated through the diode-connected first transistor T1 and then transmitted to the light emitting device ED.

The seventh transistor T7 includes a first electrode connected to the first initialization voltage line VL3 to which the first initialization voltage VINT1 is transmitted, a second electrode connected to the second electrode of the sixth transistor T6, and a third electrode connected to the second write scan line SWLj+1. The first initialization voltage VINT1 may have a voltage level lower than or equal to the second initialization voltage VINT2. According to an embodiment of the present disclosure, each of the first and second initialization voltages VINT1 and VINT2 may have a voltage of −3.5 V.

The third terminal of each of the first to seventh transistors T1 to T7 may be a gate electrode.

As described above, a first end of the capacitor Cst is connected to the third electrode of the first transistor T1, and a second end of the capacitor Cst is connected to the first driving voltage line VLL. A cathode of the light emitting device ED may be connected to the second driving voltage line VL2 that transmits the second driving voltage ELVSS. The second driving voltage ELVSS may have a voltage level lower than that of the first driving voltage ELVDD. According to an embodiment of the present disclosure, the second driving voltage ELVSS may have a voltage level lower than those of the first and second initialization voltages VINT1 and VINT2.

When a high-level initialization scan signal SIj is provided through the initialization scan line SILj, the fourth transistor T4 is turned on in response to the high-level initialization scan signal SIj. The second initialization voltage VINT2 is transmitted to the third electrode of the first transistor T1 through the turned-on fourth transistor T4, and the first node N1 is initialized by the second initialization voltage VINT2. Accordingly, the high level duration of the initialization scan signal SIj may be the initialization duration of the pixel PXij.

Next, when the high-level compensation scan signal SCj is supplied through the compensation scan line SCLj, the third transistor T3 is turned on. The first transistor T1 is diode-connected by the turned-on third transistor T3 and is biased in the forward direction. In addition, the second transistor T2 is turned on in response to the first write scan signal SWj in the low level. Then, a compensation voltage ("Di-Vth"), which is reduced by a threshold voltage Vth of the first transistor T1 from the data signal Di supplied through the data line DLi, is applied to the third electrode of the first transistor T1. In other words, the potential at the third electrode of the first transistor T1 may be the compensation voltage ("Di-Vth").

The first driving voltage ELVDD and the compensation voltage ("Di-Vth") may be applied to opposite terminals of the capacitor Cst, and charges, which correspond to a voltage difference between the opposite terminals of the capacitor Cst, may be stored in the capacitor Cst. In this case, the high level duration of the compensation scan signal SCj may be referred to as the compensation duration of the pixel PXij.

The seventh transistor T7 is turned on by receiving a low-level second write scan signal SWj+1 through the second write scan line SWLj+1. A portion of the driving current Id may be discharged through the seventh transistor T7 as a bypass current Ibp, by the seventh transistor T7.

When the light emitting device ED emits a light under the condition that a minimum current of the first transistor T1 displaying a black image flows as a driving current, the black image fails to be normally displayed. Accordingly, the seventh transistor T7 in the pixel PXij according to an embodiment of the present disclosure may allow a portion of the minimum current of the first transistor T1 to pass by as the bypass current Ibp, through a current path other than a current path to the light emitting device ED. In this case, the minimum current of the first transistor T1 refers to a current flowing, under the condition that the first transistor T1 is turned off, as a gate-source voltage of the first transistor T1 is smaller than the threshold voltage Vth. Accordingly, the minimum driving current (e.g., a current of 10 pA or less) is transmitted to the light emitting device ED to express an image having black luminance, under the condition that the first transistor T1 is turned off. When the minimum driving current flows to express the black image, the bypass transmission effect of the bypass current Ibp may be greatly exhibited. In contrast, when a large driving current flows to display a normal image or a white image, the bypass transmission effect of the bypass current Ibp is hardly exhibited. Accordingly, when the driving current flows to express a black image, since a quantity of the bypass current Ibp passing through the seventh transistor T7 is subtracted from the quantity of the driving current Id, a light emitting current Ied of the light emitting device ED has the minimum current quantity such that the black image may be securely expressed. Accordingly, a contrast ratio may be enhanced by accurately implementing the image having the black luminance by using the seventh transistor T7.

Next, the light emitting control signal EMj supplied from the light emitting control line EMLj is changed from a high level to a low level. The fifth transistor T5 and the sixth transistor T6 are turned on in response to the light emitting control signal EMj in the low level. In this case, the driving current Id is generated based on a voltage difference between the voltage at the third electrode of the first transistor T1 and the first driving voltage ELVDD. The driving current Id is supplied to the light emitting device ED through the sixth transistor T6, such that the current Ied flows through the light emitting device ED.

Referring to FIG. 10, the sensor FXij is connected with the i-th readout line RLi (hereinafter, a "readout line") among the readout lines RL1 to RLm, the initialization scan line SILj, and the compensation scan line SCLj. The sensor FXij may be further connected with the first and second driving voltage lines VL1 and VL2, and the reset voltage line VL5.

The sensor FXij includes the photo-detector n_OPD and the sensor driving part SDC. According to an embodiment, the sensor FXij may include a plurality of photo-detectors n_OPD and one sensor driving part SDC. For example, 'n' number of photo-detectors n_OPD may be connected to one sensor driving part SDC. The photo-detector n_OPD may be a photodiode. According to an embodiment of the present disclosure, the photo-detector n_OPD may be an organic photodiode provided in the photoelectric conversion layer and including an organic material. The photo-detector n_OPD may include an anode connected to a first sensing node SN1, and a cathode connected to the second driving voltage line VL2 to transmit the second driving voltage ELVSS.

The sensor driving part SDC includes three transistors ST1, ST2 and ST3. The three transistors ST1 to ST3 may include a reset transistor ST1, an amplification transistor ST2, and an output transistor ST3. Some of the reset transistor ST1, the amplification transistor ST2, and the output transistor ST3 may be P-type transistors, and rest of the reset transistor ST1, the amplification transistor ST2, and the output transistor ST3 may be N-type transistors. According to an embodiment of the present disclosure, the amplification transistor ST2 may be a PMOS transistor, and the reset transistor ST1 and the output transistor ST3 may be NMOS transistors. However, the present disclosure is not limited thereto. For example, the reset transistor ST1, the amplification transistor ST2, and the output transistor ST3 may be all N-type transistors or all P-type transistors.

Some (e.g., the reset transistor ST1 and the output transistor ST3) of the reset transistor ST1, the amplification transistor ST2, and the output transistor ST3 may be transistors of the same type as those of the third and fourth transistors T3 and T4 in the pixel PXij. Some (e.g., the amplification transistor ST2) of the reset transistor ST1, the amplification transistor ST2, and the output transistor ST3 may be transistors of the same type as those of the first and second transistors T1 and T2 in the pixel PXij.

The circuit configuration of the sensor driving part SDC according to the present disclosure is not limited to that illustrated in FIG. 10. The sensor driving part SDC illustrated in FIG. 10 is provided for illustrative purposes, and the configuration of the sensor driving part SDC may be modified and replicated.

The reset transistor ST1 includes a first electrode connected to a reset voltage line VL5 to receive the reset voltage VRST, a second electrode connected to the first sensing node SN1, and a third electrode connected to the compensation scan line SCLj to receive the compensation scan signal SCJ. The reset transistor ST1 may reset the potential at the first sensing node SN1 to the reset voltage VRST, in response to the compensation scan signal SCj. According to an embodiment of the present disclosure, the reset voltage VRST may have a voltage level corresponding to an activation duration (e.g., a low-level duration) of the first and second write scan signals SWj and SWj+1. The reset voltage VRST may have a voltage level lower than the voltage level of the second driving voltage ELVSS.

The reset transistor ST1 may include a plurality of sub-reset transistors connected in series between the reset voltage line VL5 and the first sensing node SN1. According to an embodiment, the reset transistor ST1 includes a first sub-reset transistor ST1_1 and a second sub-reset transistor ST1_2. A third electrode of the first sub-reset transistor ST1_1 and a third electrode of the second sub-reset transistor ST1_2 are connected to the compensation scan line SCLj. In other words, the gates of the first sub-reset transistor ST1_1 and the second sub-reset transistor ST1_2 are connected to the compensation scan line SCLj. In addition, a second electrode of the first sub-reset transistor ST1_1 and a first electrode of the second sub-reset transistor ST1_2 may be electrically connected to each other. In addition, a first electrode of the first sub-reset transistor ST1_1 may be connected to the reset voltage line VL5, and a second electrode of the second sub-reset transistor ST1_2 may be electrically connected to the first sensing node SN1. However, the number of sub-reset transistors is not limited thereto, but may be variously modified.

The amplification transistor ST2 includes a first electrode connected to the first driving voltage line VL1 to receive the first driving voltage ELVDD, a second electrode connected to a second sensing node SN2, and a third electrode connected to the first sensing node SN1. The amplification transistor ST2 may be turned on depending on the potential at the first sensing node SN1 to apply the first driving voltage ELVDD to the second sensing node SN2.

The output transistor ST3 includes a first electrode connected to the second sensing node SN2, a second electrode connected to the readout line RLi, and a third electrode connected to the initialization scan line SILj to receive the initialization scan signal SIj. The output transistor ST3 may transmit a sensing signal FSi to the readout line RLi, in response to the initialization scan signal SIj Referring to FIG. 11, a frame FR may include a light emitting duration EP and a non-light emitting duration NEP divided depending an operation of the pixel PXij. The light emitting duration EP corresponds to a low level duration (e.g., an activation duration) of the light emitting control signal EMj, and the non-light emitting duration NEP corresponds to a high level duration (e.g., a deactivation duration) of the light emitting control signal EMj. According to an embodiment of the present disclosure, when the display panel DP (illustrated in FIG. 3) operates at the frequency of 60 Hz, one frame FR may have a duration corresponding to 16.7 ms. The duration of one frame FR may be varied depending on the driving frequency of the display panel DP.

One frame FR may include a sensing duration AP1, a reset duration AP2, and a light exposure duration depending on the operation of the sensor FXij. The sensing duration AP1 and the reset duration AP2 may be overlapped with the non-light emitting duration NEP. In other words, the sensing duration AP1 and the reset duration AP2 may not occur during the light emitting duration EP. The light exposure duration of the sensor FXij may correspond to the light emitting duration EP of the pixel PXij. The photo-detector OPD is exposed to light for the light emitting duration EP. The light may be output from the light emitting device ED of the pixel PXij.

When the hand US_F (see FIG. 1) of the user touches the display surface, the photo-detector OPD generates photo charges corresponding to light reflected from a ridge of a fingerprint or a valley between the ridges, and the generated photo charges may be accumulated in the first sensing node SN1.

The amplification transistor ST2 may be a source follower amplifier which generates a source-drain current in proportion to the quantity of charges of the first sensing node SN1, which are input to the third electrode of the amplification transistor ST2.

During the sensing duration AP1, the high-level initialization scan signal SIj is supplied to the output transistor ST3 through the initialization scan line SILj. The sensing duration AP1 may be referred to as an activation duration (e.g., a high level duration) of the initialization scan signal SIj. The activation duration of the initialization scan signal SIj and the compensation scan signal SCj are determined depending on the length of the high duration of a relevant clock signal. For example, the initialization scan signal SIj has the activation duration corresponding to a high duration of a first clock signal CK1, and the compensation scan signal SCj has the activation duration corresponding to a high duration of a second clock signal CK2. The first and second clock signals CK1 and CK2 may have phases reverse to each other. Accordingly, the activation duration of the initialization scan signal SIj and the activation duration of the compensation scan signal SCj may not be overlapped with each other.

When the output transistor ST3 is turned on in response to the high-level initialization scan signal SIj, the sensing signal FSi corresponding to a current flowing through the amplification transistor ST2 may be output to the readout line RLi. The sensing duration AP1 of the sensor FXij may correspond to the initialization duration of the pixel PXij.

Next, when the high-level compensation scan signal SCj is supplied through the compensation scan line SCLj for the reset duration AP2, the reset transistor ST1 is turned on. The reset duration AP2 may be referred to as an activation duration (e.g., a high level duration) of the compensation scan signal SCj. In this case, since the reset voltage VRST is provided to the first electrode of the reset transistor ST1, the first sensing node SN1 may be reset to the reset voltage VRST. The reset duration AP2 of the sensor FXij may correspond to the compensation duration of the pixel PXij.

Next, for the light emitting duration EP, the photo-detector OPD may generate photo-charges corresponding to the received light, and the generated photo-charges may be accumulated in the first sensing node SNL.

As described above, the display panel DP may include the pixel PXij and the sensor FXij, and the sensor FXij may be driven through the initialization scan signal SIj and the compensation scan signal SCj for driving the pixel PXij. In particular, the initialization scan signal SIj and the compensation scan signal SCj supplied to the third and fourth transistors T3 and T4 of the pixel PXij may be supplied to the reset transistor ST1 and the output transistor ST3 of the sensor FXij. In other words, the initialization scan signal SIj and the compensation scan signal SCj may be supplied to each of the pixel PXij and the second FXij. Therefore, since an additional signal line or circuit to drive the sensor FXij is not required, even if the sensor FXij is disposed on the display panel DP, the reduction of an aperture ratio may be minimized or prevented.

Figure 12:
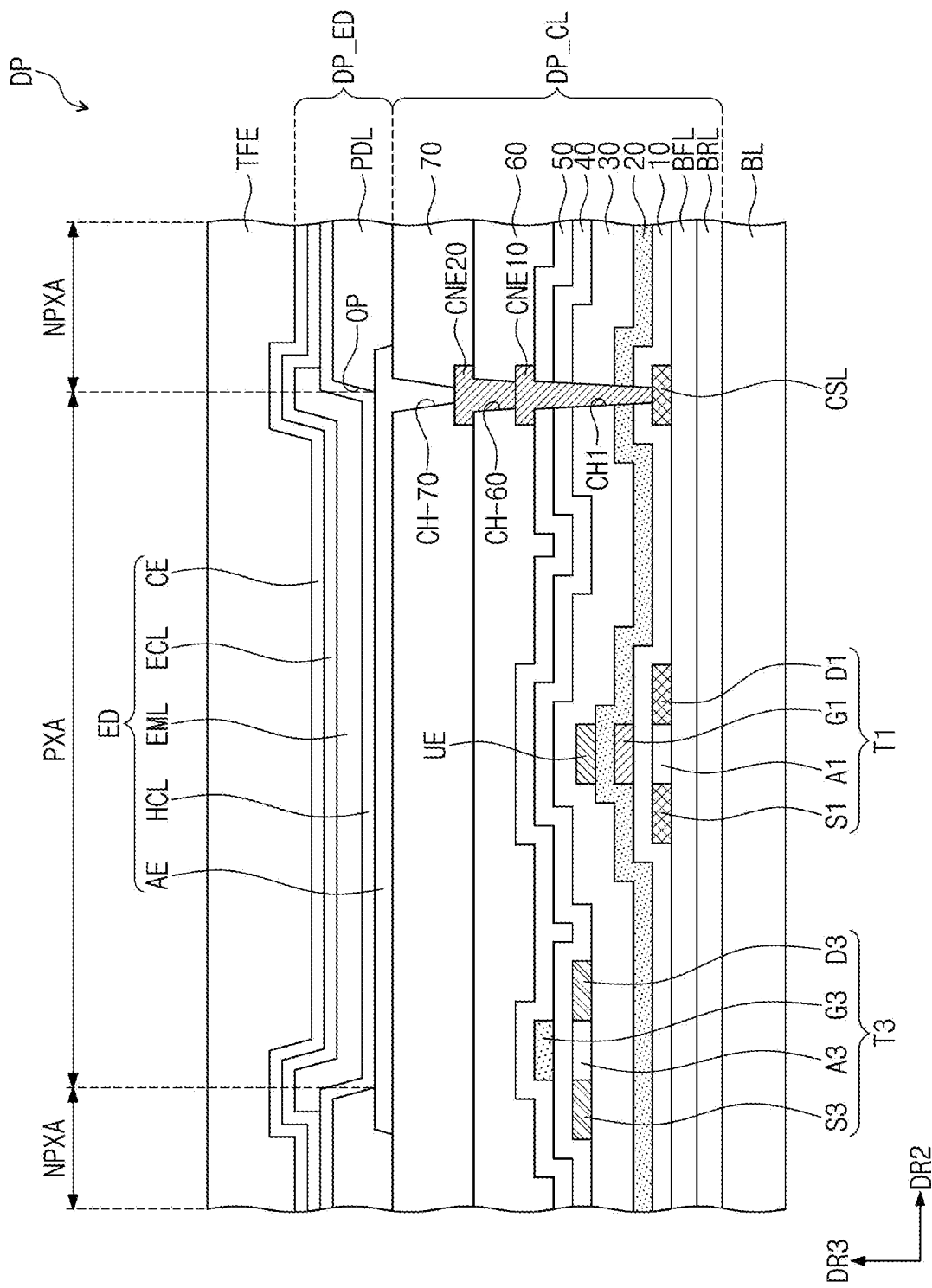
FIG. 12 is a cross-sectional view illustrating a pixel of a display panel according to an embodiment of the present disclosure.

FIG. 12 is a cross-sectional view illustrating a pixel of a display panel according to an embodiment of the present disclosure.

Referring to FIG. 12, the display panel DP may include the base layer BL, the circuit layer DP_CL disposed on the base layer BL, the display layer DP_ED disposed on the circuit layer DP_CL, and the encapsulating layer TFE disposed on the display layer DP_ED.

The base layer BL may include a synthetic resin layer. The synthetic resin layer may include a thermosetting resin material. In particular, the synthetic resin layer may be a polyimide-based resin layer, and the material thereof is not specifically limited. The synthetic resin layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, and perylene-based resin. In addition, the base layer BL may include a glass substrate, a metal substrate, or an organic/inorganic composite substrate.

At least one inorganic layer is formed on a top surface of the base layer BL. The inorganic layer may include at least one of aluminum oxide, titanium oxide, silicon oxide, silicon oxynitride, zirconium oxide, or hafnium oxide. The inorganic layer may include multiple layers. The multiple inorganic layers may constitute a barrier layer BRL and/or a buffer layer BFL, to be described later. The barrier layer BRL and the buffer layer BFL may be selectively disposed.

The barrier layer BRL prevents external foreign substances from being introduced. The barrier layer BRL may include a silicon oxide layer and a silicon nitride layer. Each of the silicon oxide layer and the silicon nitride layer may include a plurality of layers, and the plurality of silicon oxide layers and the silicon nitride layers may be alternately stacked.

The buffer layer BFL may be disposed on the barrier layer BRL. The buffer layer BFL improves a bonding force between the base layer BL and a semiconductor pattern and/or a conductive pattern. The buffer layer BFL may include a silicon oxide layer and a silicon nitride layer. The silicon oxide layer and the silicon nitride layer may be alternately stacked.

A semiconductor pattern is disposed on the buffer layer BFL. Hereinafter, a semiconductor pattern directly disposed on the buffer layer BFL is referred to as a first semiconductor pattern. The first semiconductor pattern may include a silicon semiconductor. The first semiconductor pattern may include polysilicon. However, the present disclosure is not limited thereto. For example, the first semiconductor pattern may include amorphous silicon.

FIG. 12 illustrates only a portion of the first semiconductor pattern, and the first semiconductor pattern may be further disposed in another region of the pixel PXij (refer to FIG. 10). An electrical property of the first semiconductor pattern may vary depending on whether the first semiconductor pattern is doped. The first semiconductor pattern may include a doped region and an undoped region. The doped region may be doped with N-type dopants or P-type dopants. A P-type transistor includes a doped region doped with the P-type dopants, and an N-type transistor includes a doped region doped with the N-type dopants.

The doped region has higher conductivity than the undoped region, and may operate as an electrode or a signal line. The undoped region may correspond to an active (or channel) of a transistor. In other words, a portion of the first semiconductor pattern may be the active of the transistor, another portion of the first semiconductor pattern may be a source or drain of the transistor, and still another portion of the first semiconductor pattern may be a connection signal line (or connection electrode).

As illustrated in FIG. 12, a first electrode S1, a channel part A1, and a second electrode D1 of the first transistor T1 are formed from the first semiconductor pattern. The first electrode S1 and the second electrode D1 of the first transistor T1 extend in opposite directions from the channel part A1.

A portion of a connection signal line CSL formed from the semiconductor pattern is illustrated in FIG. 12. The connection signal line CSL may be electrically connected to the second electrode of the sixth transistor T6 (refer to FIG. 10), when viewed in a plan view.

A first insulating layer 10 is disposed on the buffer layer BFL. The first insulating layer 10 is commonly overlapped with the plurality of pixels PX (refer to FIG. 3) to cover the first semiconductor pattern. The first insulating layer 10 may be an inorganic layer and/or an organic layer, and may have a single-layer structure or a multi-layer structure. The first insulating layer 10 may include at least one of aluminum oxide, titanium oxide, silicon oxide, silicon oxynitride, zirconium oxide, or hafnium oxide. According to an embodiment, the first insulating layer 10 may be a silicon oxide layer in a single layered structure. An insulating layer of the circuit layer DP_CL to be described later may be an inorganic layer and/or an organic layer as well as the first insulating layer 10, and may have a single-layer structure or a multi-layer structure. The inorganic layer may include at least one of the materials described above.

A third electrode G1 of the first transistor T1 is disposed on the first insulating layer 10. The third electrode G1 may be a portion of a metal pattern. The third electrode G1 of the first transistor T1 is overlapped with the channel part A1 of the first transistor T1. For example, the first insulating layer 10 may be disposed between the third electrode G1 and the channel part A1 of the first transistor T1. In the process of doping the first semiconductor pattern, the third electrode G1 of the first transistor T1 may serve as a mask.

A second insulating layer 20 is disposed on the first insulating layer 10 to cover the third electrode G1. The second insulating layer 20 is commonly overlapped with the plurality of pixels PX. The second insulating layer 20 may be an inorganic layer and/or an organic layer, and may have a single-layer structure or a multi-layer structure. According to an embodiment, the second insulating layer 20 may be a silicon oxide layer in a single layered structure.

An upper electrode UE may be disposed on the second insulating layer 20. The upper electrode UE may be overlapped with the third electrode GL. For example, the insulating layer 20 may be disposed between the upper electrode UE and the third electrode GL. The upper electrode UE may be a portion of a metal pattern or a portion of a doped semiconductor pattern. A portion of the third electrode G1 and the upper electrode UE overlapped with the portion of the third electrode G1 may form the capacitor Cst (refer to FIG. 10). According to an embodiment of the present disclosure, the upper electrode UE may be omitted.

According to an embodiment, the second insulating layer 20 may be substituted with an insulating pattern. The upper electrode UE is disposed on the insulating pattern. The upper electrode UE may serve as a mask to form an insulating pattern from the second insulating layer 20.

A third insulating layer 30 is disposed on the second insulating layer 20 to cover the upper electrode UE. According to an embodiment, the third insulating layer 30 may be a silicon oxide layer in a single layered structure. A semiconductor pattern is disposed on the third insulating layer 30. Hereinafter, the semiconductor pattern directly disposed on the third insulating layer 30 is referred to as a second semiconductor pattern. The second semiconductor pattern may include a metal oxide. The oxide semiconductor of the second semiconductor layer may include a crystalline or amorphous oxide semiconductor. For example, the oxide semiconductor may include a metal oxide of zinc (Zn), indium (In), gallium (Ga), tin (Sn), titanium (Ti), or the mixture of a metal, such as zinc (Zn), indium (In), gallium (Ga), tin (Sn), titanium (Ti), and the oxide of the metal. The oxide semiconductor may include indium-tin oxide (ITO), indium-gallium-zinc oxide (IGZO), zinc oxide (ZnO), indium-zinc oxide (IZO), zinc-indium oxide (ZIO), indium oxide (InO), titanium oxide (TiO), indium-zinc-tin oxide (IZTO), or zinc-tin oxide (ZTO).

FIG. 12 illustrates only a portion of the first semiconductor pattern, and the second semiconductor pattern may be further disposed in another region of the pixel PXij (refer to FIG. 10). The second semiconductor pattern may include a plurality of regions divided depending on whether the metal oxide is reduced. A region (hereinafter referred to as a "reduction region"), in which the metal oxide is reduced, has a higher conductivity than a region (hereinafter referred to as a "non-reduction region") in which the metal oxide is not reduced. The reduction region may operate as an electrode or signal line. The non-reduction region may correspond to a channel part of a transistor. In other words, a portion of the second semiconductor pattern may be a channel part of a transistor, and another portion of the second semiconductor pattern may be a first electrode or a second electrode of the transistor.

As illustrated in FIG. 12, a first electrode S3, a channel part A3, and a second electrode D3 of the third transistor T3 are formed from the first semiconductor pattern. The first electrode S3 and the second electrode D3 include a metal reduced from a metal oxide semiconductor. The first electrode S3 and the second electrode D3 may include a metal layer having a specific thickness from a top surface of the second semiconductor pattern and including the reduced metal.

A fourth insulating layer 40 is disposed on the third insulating layer 30 to cover the second semiconductor pattern. According to an embodiment, the fourth insulating layer 40 may be a silicon oxide layer in a single layered structure. A third electrode G3 of the third transistor T3 is disposed on the third insulating layer 30. The third electrode G3 may be a portion of a metal pattern. The third electrode G3 of the third transistor T3 is overlapped with a channel part A3 of the third transistor T3. The fourth insulating layer 40 may be disposed between the third electrode G3 and the channel part A3 of the third transistor T3.

According to an embodiment of the present disclosure, the fourth insulating layer 40 may be substituted with an insulating pattern. The third electrode G3 of the third transistor T3 is disposed on the insulating pattern. According to an embodiment, the third electrode G3 may have the same shape as the shape of the insulating pattern, when viewed in a plan view. According to an embodiment, for the convenience of explanation, one third electrode G3 is illustrated, but the third transistor T3 may include two third electrodes.

A fifth insulating layer 50 is disposed on the fourth insulating layer 40 to cover the third electrode G3. According to an embodiment, the fifth insulating layer 50 may include a silicon oxide layer and a silicon nitride layer. The fifth insulating layer 50 may include a plurality of silicon oxide layers and a plurality of silicon nitride layers, which are alternately stacked.

The first electrode and the second electrode of the fourth transistor T4 (refer to FIG. 10) may be formed through the same process as the process for forming the first electrode S3 and the second electrode D3 of the third transistor T3. In addition, in the sensor FXij (refer to FIG. 10), the first and second electrodes of the reset transistor ST1 (refer to FIG. 10) and the first and second electrodes of the output transistor ST3 (refer to FIG. 10) may be formed through the same process as the process for forming the first electrode S3 and the second electrode D3 of the third transistor T3.

At least one insulating layer is further disposed on the fifth insulating layer 50. According to an embodiment, a sixth insulating layer 60 and a seventh insulating layer 70 may be disposed on the fifth insulating layer 50. The sixth insulating layer 60 and the seventh insulating layer 70 may be organic layers and may have a single-layer structure or a multi-layer structure. Each of the sixth insulating layer 60 and the seventh insulating layer 70 may be a polyimide-based resin layer having a single layer structure. However, the present disclosure is not limited thereto. The sixth insulating layer 60 and the seventh insulating layer 70 may include at least any one of acrylate-based resin, methacrylate-based resin, polyisoprene-based resin, vinyl-based resin, epoxy-based resin, urethane-based resin, cellulose-based resin, siloxane-based resin, polyamide-based resin, or perylene-based resin.

A first connection electrode CNE10 may be disposed on the fifth insulating layer 50. The first connection electrode CNE10 may be connected to the connection signal line CSL through a first contact hole CH1 formed through the first to fifth insulating layers 10 to 50, and a second connection electrode CNE20 may be connected to the first connection electrode CNE10 through a contact hole CH-60 formed through the sixth insulating layer 60. According to an embodiment of the present disclosure, at least one of the fifth insulating layer 50 or the sixth insulating layer 60 may be omitted.

The display layer DP_ED includes the light emitting device ED and the pixel defining layer PDL. An anode AE of the light emitting device ED is disposed on the seventh insulating layer 70. The anode AE of the light emitting device ED may be connected with the second connection electrode CNE20 through a contact hole CH-70 formed through the seventh insulating layer 70.

An opening OP in the pixel defining layer PDL exposes at least a portion of the anode AE of the light emitting device ED. The opening OP of the pixel defining layer PDL may define a light emitting region PXA. For example, the plurality of pixels PX (refer to FIG. 3) may be arranged on a plane of the display panel DP (refer to FIG. 3) depending on a specific rule. A region, in which the plurality of pixels PX are arranged, may be referred to as a pixel region, and one pixel region may include the light emitting region PXA and a non-light emitting region NPXA adjacent to the light emitting region PXA. The non-light emitting region NPXA may surround the light emitting region PXA.

A hole control layer HCL may be commonly disposed in the light emitting region PXA and the non-light emitting region NPXA. A common layer, such as the hole control layer HCL, may be commonly formed in the plurality of pixels PX. The hole control layer HCL may include a hole transport layer and a hole injection layer.

A light emitting layer EML is disposed on the hole control layer HCL. The light emitting layer EML may be disposed only in a region corresponding to the opening OP. The light emitting layer EML may be divided and formed in each of the plurality of pixels PX.

According to an embodiment, although the patterned light emitting layer EML is illustrated, the light emitting layer EML may be commonly disposed in the plurality of pixels PX. In this case, the light emitting layer EML may generate white light or blue light. In addition, the light emitting layer EML may have a multi-layer structure.

An electron control layer ECL is disposed on the light emitting layer EML. The electron control layer ECL may include an electron transport layer and an electron injection layer. A cathode CE of the light emitting device ED is disposed on the electron control layer ECL. The electron control layer ECL and the cathode CE are commonly disposed in the plurality of pixels PX.

The encapsulating layer TFE is disposed on the cathode CE. The encapsulating layer TFE may cover the plurality of pixels PX. According to an embodiment, the encapsulating layer TFE directly covers the cathode CE. According to an embodiment of the present disclosure, the display panel DP may further include a capping layer to directly cover the cathode CE. According to an embodiment of the present disclosure, the stacked structure of the light emitting device ED may have a structure vertically reversed to the structure illustrated in FIG. 12.

Figure 13:
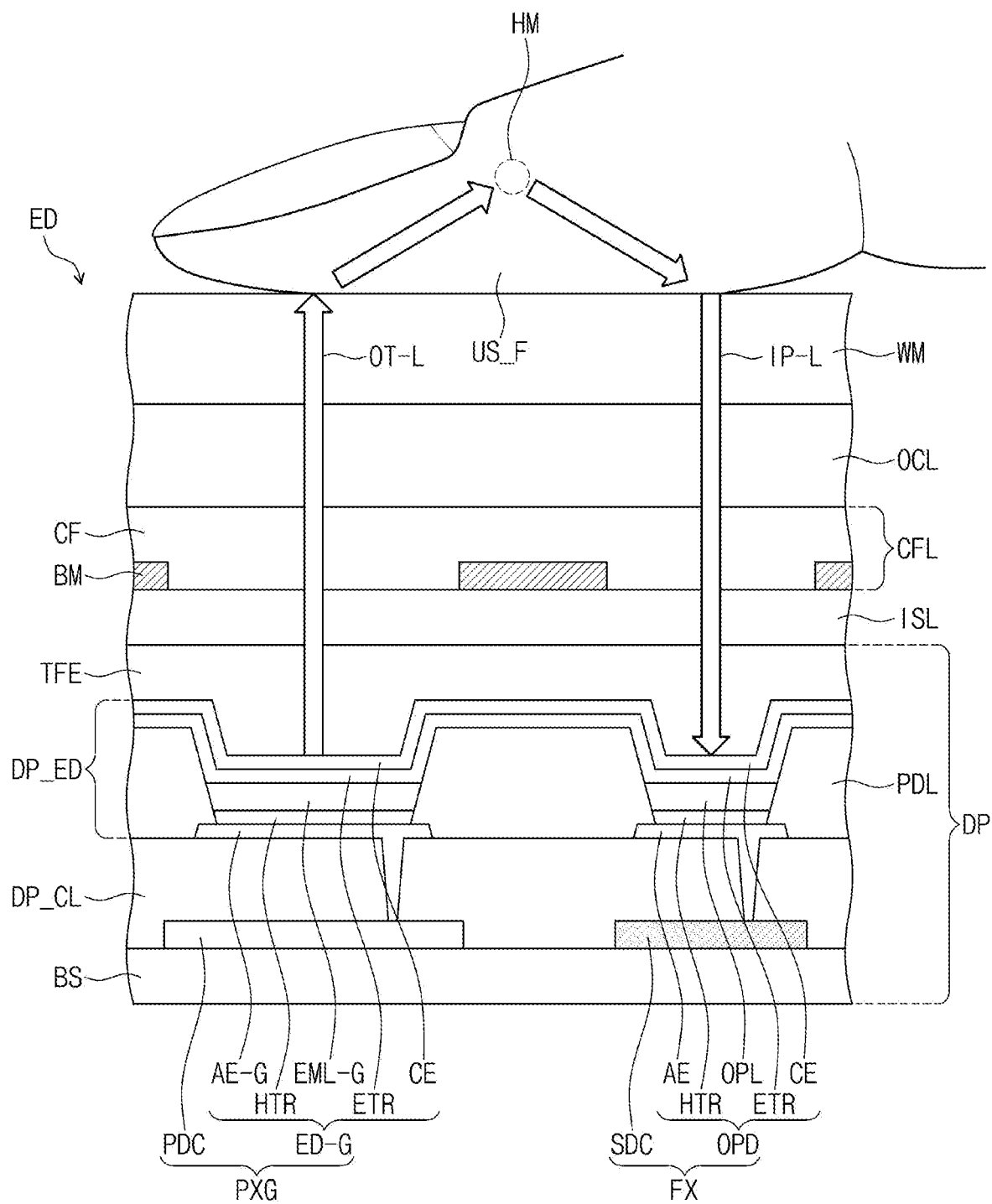
FIG. 13 is a cross-sectional view of a display device according to an embodiment of the present disclosure.

FIG. 13 is a cross-sectional view of a display device, according to an embodiment of the present disclosure. In the following description, the duplication of the description made with reference to FIG. 4 will be omitted.

In FIG. 13, according to an embodiment, light OT-L emitted from the green light emitting device ED_G is partially absorbed and reflected by hemoglobin HM of the hand US_F of the user to form the reflective light IP-L, and the reflective light IP-L may be incident to the photodetector OPD included in the display layer DP_ED. A quantity of light absorbed to the hemoglobin HM may vary depending on a quantity of light incident to the photodetector OPD. Accordingly, oxygen saturation may be recognized, and a heart rate of the user's biometric information may be measured.

According to an embodiment of the present disclosure, in the display device including the display panel having the sensor, which is to sense biometric information, and the pixel, the space occupied by the sensor driving circuit may be reduced, and the space occupied by the pixel driving circuit may be ensured, thereby increasing the resolution of the display panel.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A display device, comprising:
a display layer including a light emitting device, a photo-detector, and a dummy device; and
a circuit layer including a pixel driving part, which is connected to the light emitting device, and a sensor driving part which is connected to the photo-detector,
wherein the light emitting device and the dummy device are overlapped with the pixel driving part,
wherein the light emitting device includes:
a first electrode and a second electrode facing each other; and
a light emitting layer interposed between the first electrode and the second electrode to emit red light, blue light, or green light,
wherein each of the photo-detector and the dummy device includes:
a first electrode and a second electrode facing each other; and
a photo-electric converting layer interposed between the first electrode and the second electrode to convert incident light to an electrical signal,
wherein the photo-detector is overlapped with the sensor driving part,
wherein the first electrode of the dummy device is not connected to the sensor driving part,
wherein the first electrode of the light emitting device, the first electrode of the photo-detector and the first electrode of the dummy device are disposed on a same layer.

2. The display device of claim 1, wherein the dummy device is disposed in the same layer as a layer of the photo-electric converting layer, and is floated.

3. The display device of claim 1, wherein the pixel driving part includes:
a pixel driving circuit configured to drive the light emitting device, and
wherein the sensor driving part includes:
a sensor driving circuit configured to drive the photo-detector.

4. The display device of claim 1, wherein a plurality of unit pixel regions are provided and wherein unit pixels are disposed in the unit pixel regions, each unit pixel including the light emitting device, and the photo-detector or the dummy device, and
wherein the photo-detector is disposed in a first unit pixel region of two adjacent unit pixel regions of the plurality of unit pixel regions, and the dummy device is disposed in a second unit pixel region of two adjacent unit pixel regions of the plurality of unit pixel regions.

5. The display device of claim 4, wherein the number of the photo-detectors disposed in the first unit pixel and the number of the dummy devices disposed in the second unit pixel region are the same.

6. The display device of claim 4, wherein 'n' number of the sensor driving parts are disposed in '2n' number of unit pixel regions, which are adjacent to each other, of the plurality of unit pixel regions, and
wherein the 'n' is a natural number.

7. The display device of claim 6, wherein the 'n' number of sensor driving parts are electrically connected to 'n' number of photo-detectors, respectively.

8. The display device of claim 4, wherein the sensor driving part is interposed between the two adjacent unit pixel regions, when viewed in a plan view.

9. The display device of claim 1, wherein the first electrode of the photo-detector is directly connected to a first electrode of another photo-detector.

10. A display device, comprising:
a display layer including a light emitting device, and a first and a second photo-detector; and
a circuit layer including a pixel driving part, which is connected to the light emitting device, and a sensor driving part which is connected to the photo-detectors,
wherein the light emitting device includes:
a first electrode and a second electrode facing each other; and
a light emitting layer interposed between the first electrode and the second electrode to emit red light, blue light, or green light,
wherein each of the photo-detectors includes:
a first electrode and a second electrode facing each other; and
a photo-electric converting layer interposed between the first electrode and the second electrode to convert incident light to an electrical signal,
wherein the first electrode of the light emitting device and the first electrode of the photo-detector are disposed on a same layer, and
wherein the first electrodes included in the first and second photo-detectors are connected to one pattern, and the one pattern is connected to the sensor driving part.

11. The display device of claim 10, wherein a plurality of unit pixel regions are provided and wherein 'x' (which is a natural number equal to or more than 1) number of light emitting devices and 'y' (which is a natural number equal to or more than 1) number of photo-detectors are disposed in the unit pixel regions.

12. The display device of claim 11, wherein the first photo-detector is disposed in a first unit pixel region of two adjacent unit pixel regions of the plurality of unit pixel regions, and the second photo-detector is disposed in a second unit pixel region of the two adjacent unit pixel regions,
wherein the first photo-detector and the second photo-detector are electrically connected to the sensor driving part.

13. The display device of claim 12, wherein the display layer further includes:
a connection part to electrically connect the first photo-detector to the second photo-detector, and
wherein the connection part is electrically connected to the sensor driving part.

14. The display device of claim 11, wherein the sensor driving part is interposed between two pixel driving parts disposed in the two adjacent unit pixel regions.

15. The display device of claim 10, wherein '2x' number of pixel driving parts and 'y' number of sensor driving parts are disposed in the two adjacent unit pixel regions of the plurality of unit pixel regions.

16. The display device of claim 15, wherein the sensor driving part is overlapped with the two adjacent unit pixel regions, when viewed in a plan view.

17. The display device of claim 10, wherein the light emitting device is connected to the pixel driving part one to one.

\* \* \* \* \*